(12) United States Patent
Chen et al.

(10) Patent No.: US 12,532,532 B2
(45) Date of Patent: Jan. 20, 2026

(54) EPITAXIAL FEATURES IN SEMICONDUCTOR DEVICES AND METHOD OF MANUFACTURING

(71) Applicant: Taiwan Semiconductor Manufacturing Company, Ltd., Hsin-Chu (TW)

(72) Inventors: Ting-Yeh Chen, Hsinchu (TW); Wei-Yang Lee, Taipei (TW); Po-Cheng Wang, Kaohsiung (TW); De-Fang Chen, Hsinchu (TW); Chao-Cheng Chen, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 18/188,010

(22) Filed: Mar. 22, 2023

(65) Prior Publication Data

US 2024/0153824 A1 May 9, 2024

Related U.S. Application Data

(60) Provisional application No. 63/382,232, filed on Nov. 3, 2022.

(51) Int. Cl.
*H10D 84/01* (2025.01)
*H10D 30/01* (2025.01)
(Continued)

(52) U.S. Cl.
CPC ....... *H10D 84/013* (2025.01); *H10D 30/0195* (2025.01); *H10D 84/0147* (2025.01);
(Continued)

(58) Field of Classification Search
CPC .......... H10D 84/0128; H10D 84/0167; H10D 84/8311; H10D 84/013; H10D 84/017;
(Continued)

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |

(Continued)

FOREIGN PATENT DOCUMENTS

| CN | 111223779 A | * | 6/2020 | ......... H10D 30/6757 |
| CN | 115132661 A | | 9/2022 | |
| TW | 202133237 A | | 9/2021 | |

OTHER PUBLICATIONS

English machine translation of CN 111223779 A (Year: 2020).*

*Primary Examiner* — Yu Chen
(74) *Attorney, Agent, or Firm* — HAYNES AND BOONE, LLP

(57) ABSTRACT

A method includes forming a stack of channel layers and sacrificial layers over a substrate, patterning the stack to form a fin-shape structure, and recessing a portion of the fin-shape structure to form a recess. A top surface of the substrate under the recess is covered at least by a bottommost sacrificial layer of the stack. The method also includes forming inner spacers on terminal ends of the sacrificial layers that are above the bottommost sacrificial layer, depositing an undoped layer in the recess, and forming a doped epitaxial feature over the undoped layer. The undoped layer covers terminal ends of a bottommost channel layer of the stack. The doped epitaxial feature covers terminal ends of the channel layers that are above the bottommost channel layer.

20 Claims, 18 Drawing Sheets

(51) Int. Cl.
*H10D 84/83* (2025.01)
*H10D 84/03* (2025.01)

(52) U.S. Cl.
CPC ......... *H10D 84/83* (2025.01); *H10D 84/8312* (2025.01); *H10D 84/832* (2025.01); *H10D 84/0128* (2025.01); *H10D 84/038* (2025.01); *H10D 84/8311* (2025.01)

(58) Field of Classification Search
CPC ............. H10D 84/8312; H10D 84/832; H10D 84/833; H10D 84/851; H10D 84/0147; H10D 84/0184; H10D 30/6735; H10D 30/507–508; H10D 30/0195
See application file for complete search history.

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2018/0114833 A1* | 4/2018 | Bao ..................... H10D 30/031 |
| 2020/0227305 A1* | 7/2020 | Cheng ................ H10D 30/6735 |
| 2022/0029023 A1* | 1/2022 | Chen ................. H10D 30/6708 |
| 2022/0037497 A1* | 2/2022 | Chung .............. H10D 84/0158 |
| 2022/0254882 A1* | 8/2022 | Chiang ................ H10D 84/013 |
| 2022/0392894 A1* | 12/2022 | More ................ H10D 30/6757 |
| 2023/0086084 A1* | 3/2023 | Yun ..................... H10D 64/258 |
| | | 257/401 |

* cited by examiner

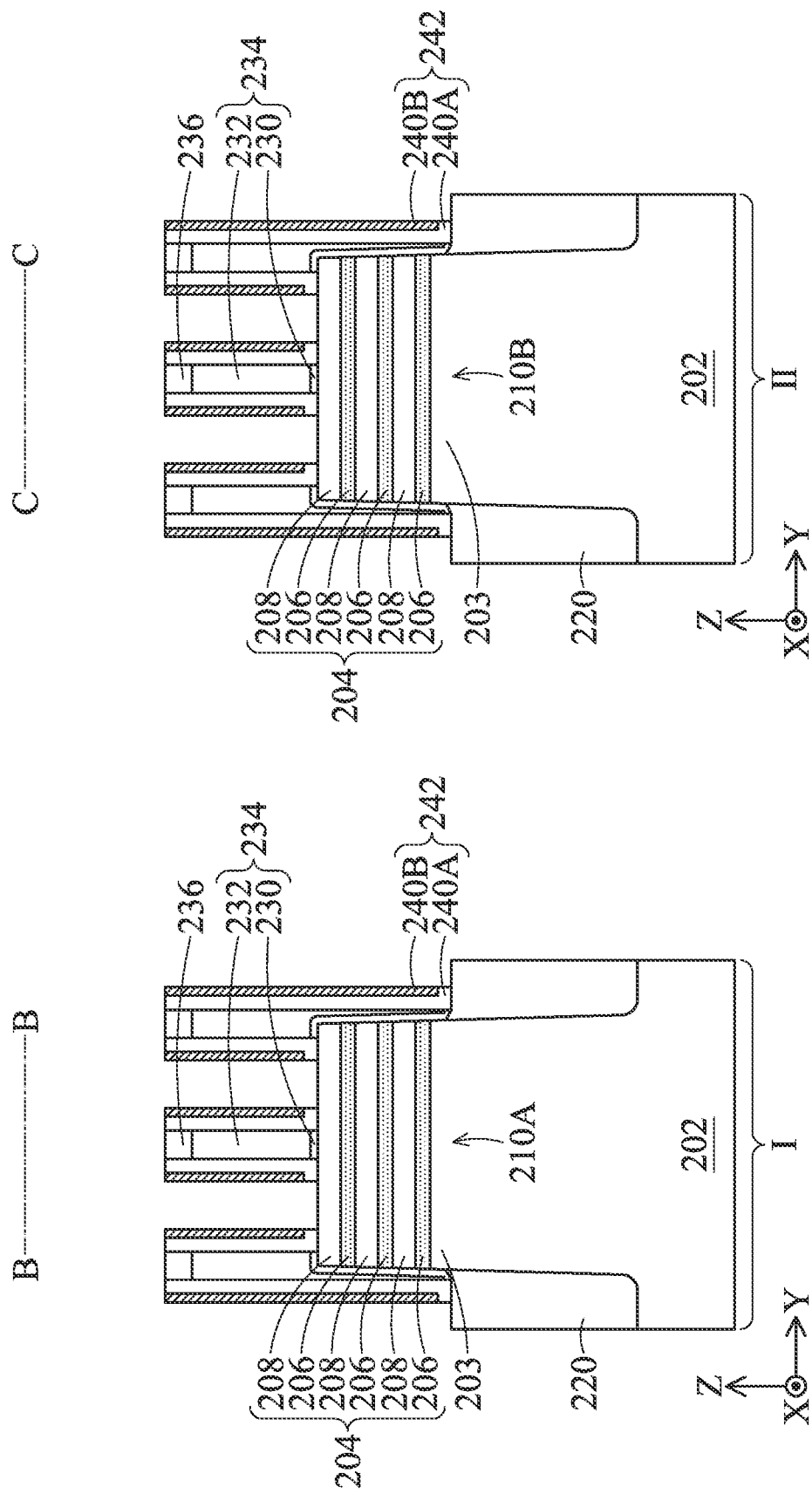

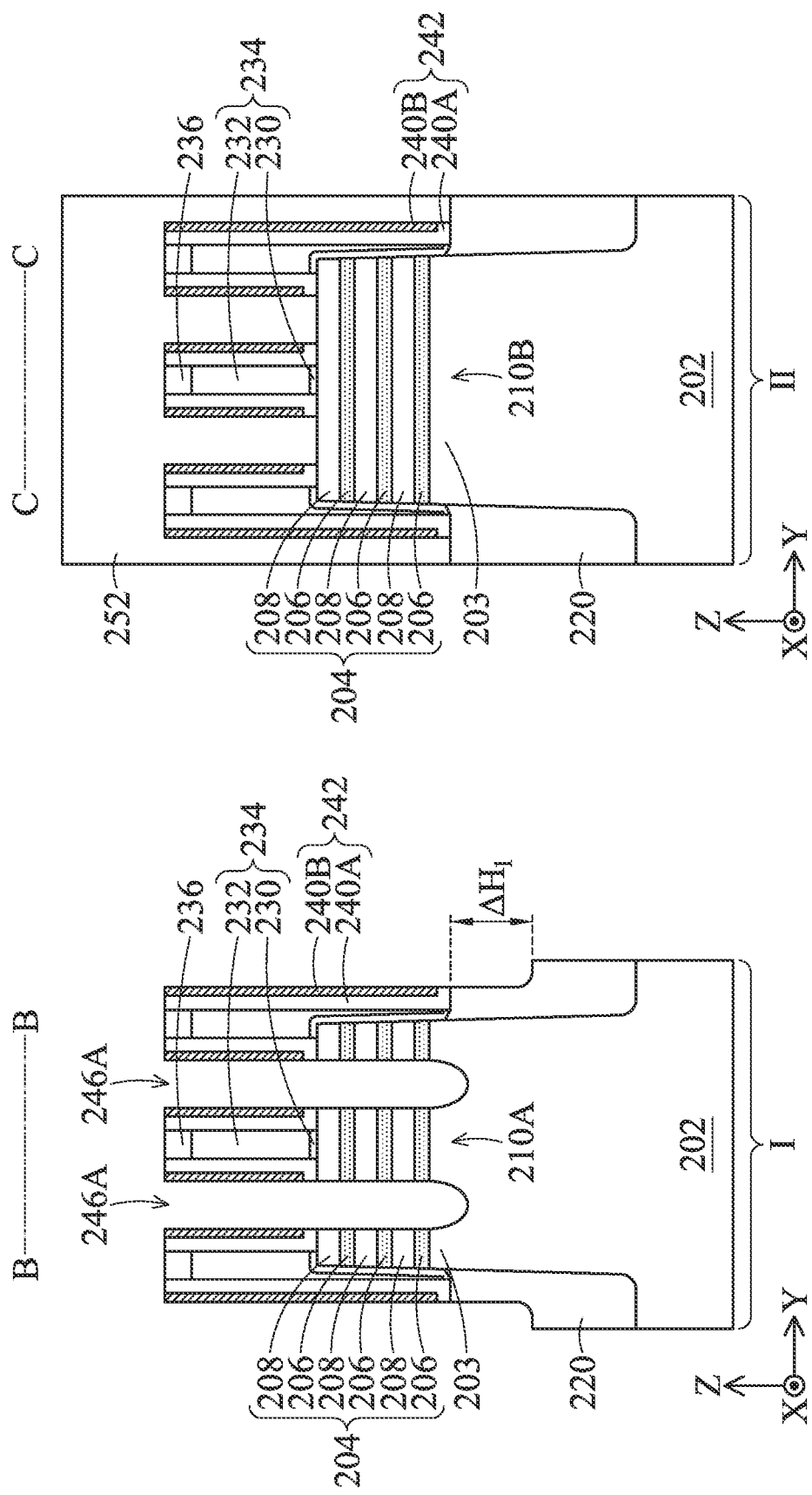

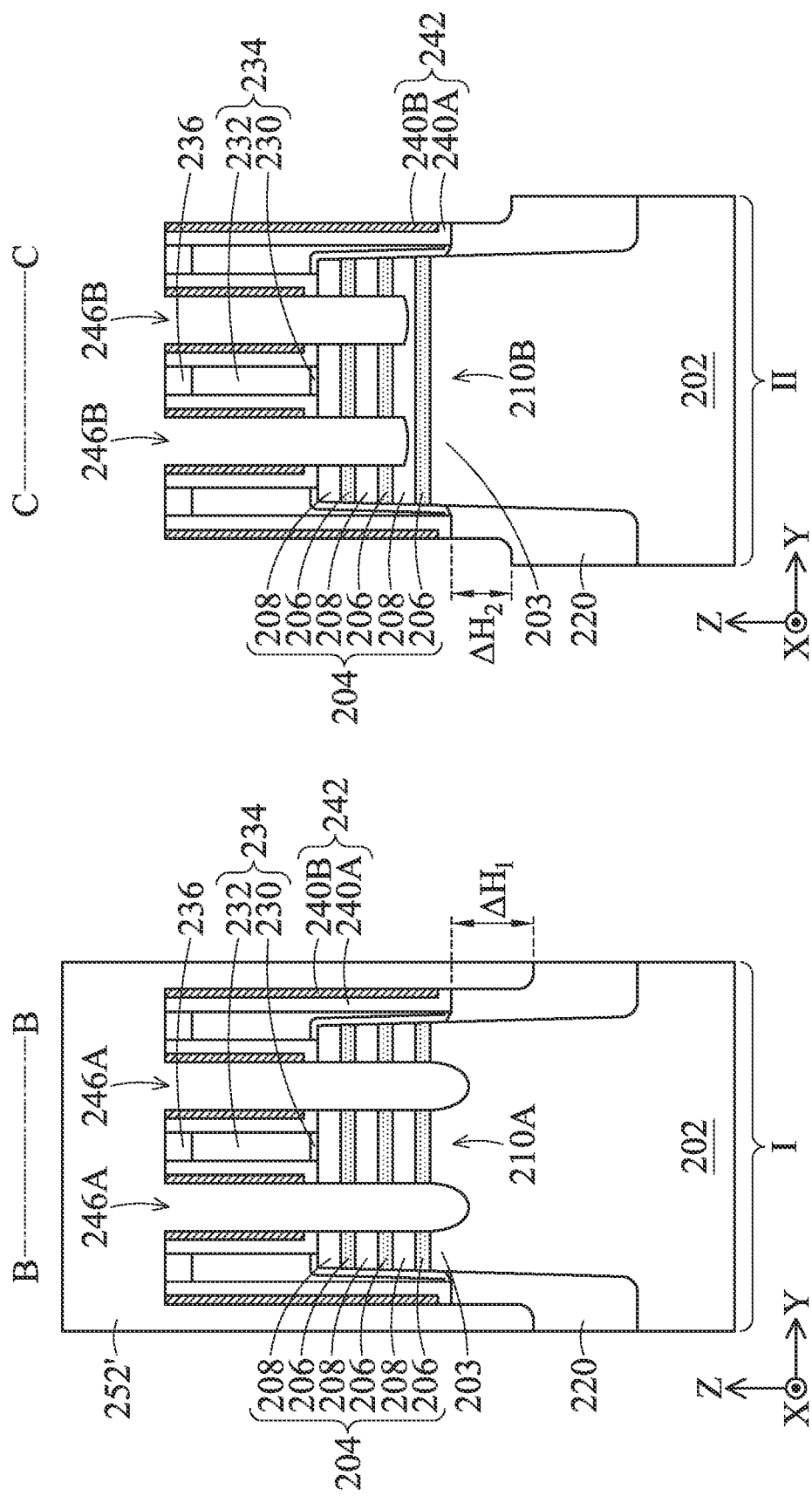

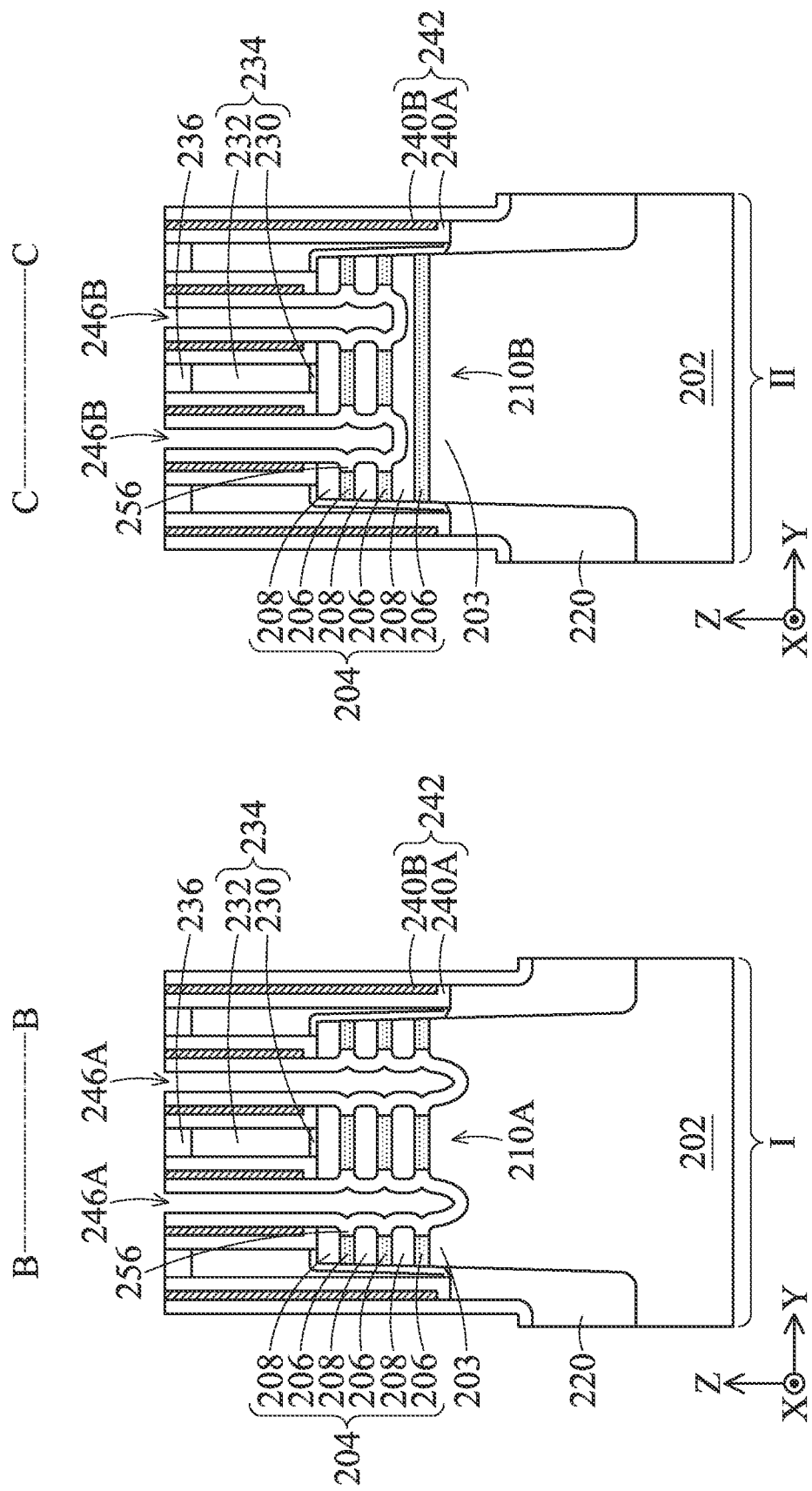

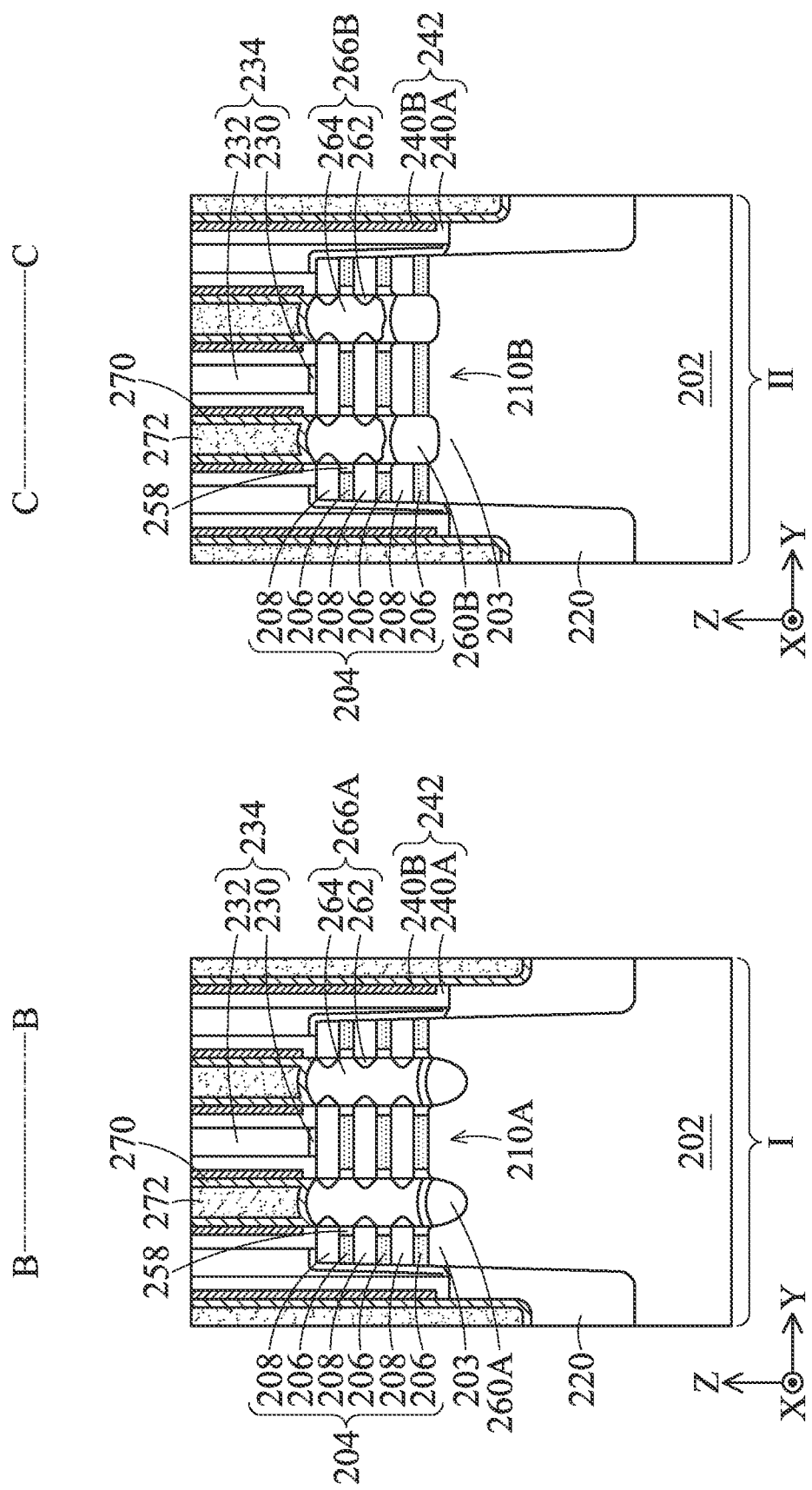

EPITAXIAL FEATURES IN SEMICONDUCTOR DEVICES AND METHOD OF MANUFACTURING

PRIORITY DATA

This application claims priority to U.S. Provisional Patent Application No. 63/382,232 filed on Nov. 3, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structures which can extend around the channel region providing access to the stacked channel layers on four sides. Compared to planar transistors, such configuration provides better control of the channel region and drastically reduces SCEs (in particular, by reducing sub-threshold leakage).

As the semiconductor industry further progresses into sub-10 nanometer (nm) technology process nodes in pursuit of higher device density, higher performance, and lower costs, parasitic capacitance influenced by the volumes of source/drain (S/D) epitaxial features should not be omitted. Particularly in high-speed circuits, such as ring oscillators, S/D epitaxial features with large volumes introduce extra parasitic capacitance, such as between S/D epitaxial features and metal gate stacks. Such parasitic capacitance increases resistance-capacitance (RC) response time of a high-speed circuit and deteriorates circuit performance. Therefore, while existing methods of manufacturing multi-gate devices have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, and 6A illustrate perspective views of a semiconductor structure during a fabrication process according to the method of FIG. 1, according to one or more aspects of the present disclosure.

FIGS. 2B, 3B, 4B, 5B, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate cross-sectional views of a semiconductor structure during a fabrication process according to the method of FIG. 1, according to one or more aspects of the present disclosure.

DETAILED DESCRIPTION

Figure 1:
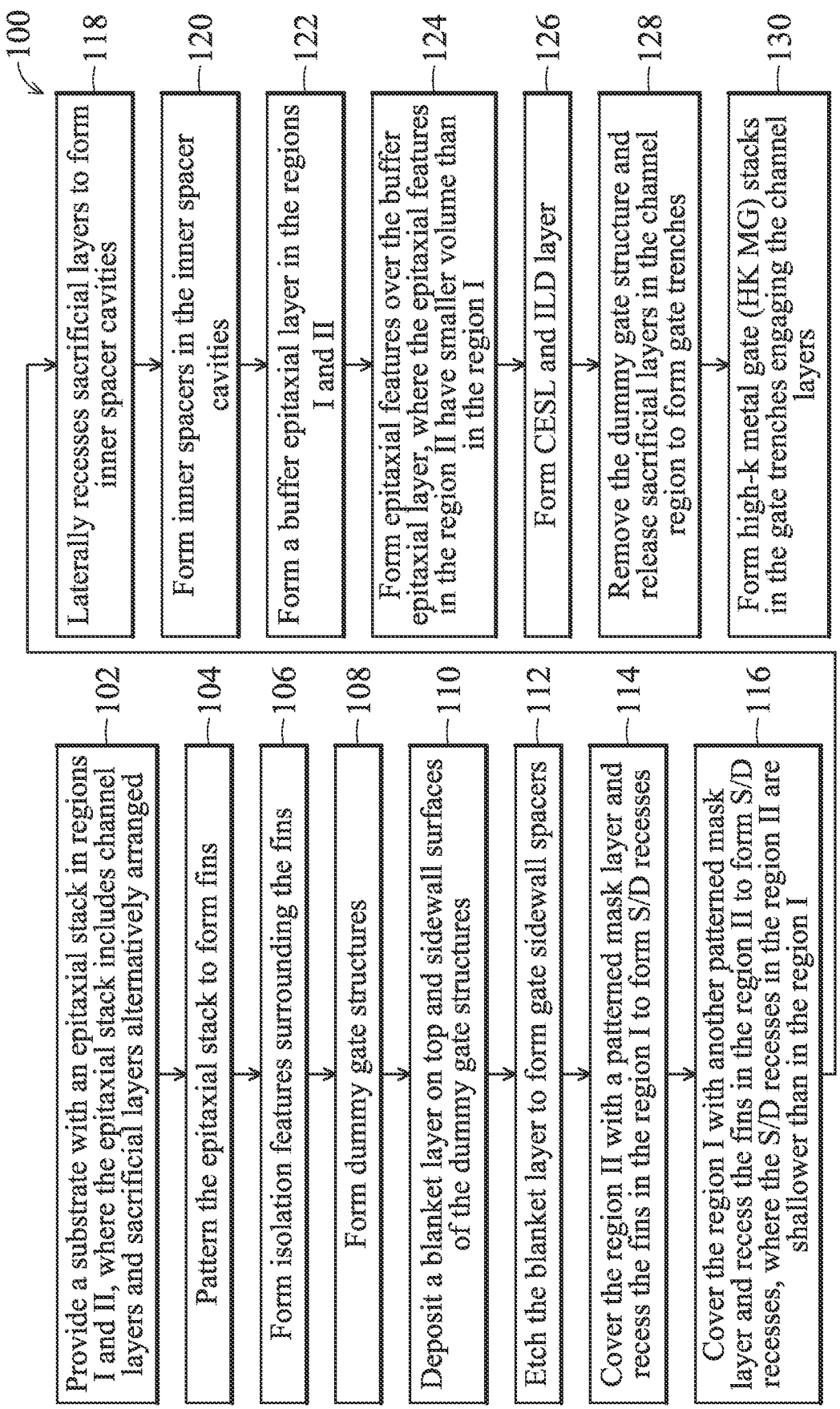
FIG. 1 shows a flow chart of a method for forming a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with source/drain (S/D) epitaxial features of different (hybrid) profiles and volumes—and consequently different (hybrid) numbers of active channel layers—in different regions suiting different applications on one chip. Source/drain epitaxial features, or source/drain features, may refer to a source or a drain, individually or collectively dependent upon the context.

A multi-gate transistor generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The details of the structure and fabrication methods of the present disclosure are described below in conjunction with the accompanied drawings, which illustrate a process of making GAA transistors, according to some embodiments. A GAA transistor has vertically-stacked horizontally-oriented channel layers. The channel layer may be referred to as "nanostructure" or "nanosheet," which is used herein to designate any material portion with nanoscale, or even microscale dimensions, and having an elongate shape, regardless of the cross-sectional shape of this portion. Thus, the term "nanostructure" or "nanosheet" as used herein designates both circular and substantially circular cross-section elongate material portions, and beam or bar-shaped material portions including for example a cylindrical in shape or substantially rectangular cross-section. GAA transistors are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as other types of MBC transistors) for carrying out the same purposes and/or achieving the same advantages of the embodiments introduced herein.

Embodiments of the present disclosure offer advantages over the existing art, though it is understood that other embodiments may offer different advantages, not all advantages are necessarily discussed herein, and no particular advantage is required for all embodiments. For example, at least two GAA transistors with S/D epitaxial features of hybrid profiles and volumes are formed in two different regions, fitting different circuit performance needs. IC devices usually include transistors in different regions that serve different functions, such as high-performance functions and high-speed (also parasitic capacitance sensitive) functions. These different functions require transistors to have different constructions. For example, in an IC chip, regions for high-performance functions may require GAA transistors with strong current driving capability, while regions for high-speed functions, such as ring oscillator circuits, may be more tolerable for less current driving capability but require GAA transistors with less parasitic capacitance. A GAA transistor's current driving capability directly relates with the number of stacked channel layers utilized for conducting currents. A channel layer utilized for conducting current is termed as an active channel layer, while a channel layer not utilized for conductive current is termed as an inactive channel layer. Thus, GAA transistors in parasitic capacitance sensitive regions may not need all the stacked channel layers to be utilized as active channel layers. Less active channel layers allow S/D epitaxial features to have a lower profile and a smaller volume. Accordingly, profiles and volumes of S/D epitaxial features and numbers of active channel layers in GAA transistors in different regions may be different in one IC chip, fitting different circuit performance needs. At the same time, it is advantageous to have similar processes and similar process windows to fabricate these different transistors to reduce cost and improve yield.

The various aspects of the present disclosure will now be described in more detail with reference to the figures. FIG. 1 illustrates a method 100 of semiconductor fabrication including fabrication of a multi-gate device. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

The method 100 is described below in conjunction with FIGS. 2A-18B. FIGS. 2A, 3A, 4A, 5A, and 6A represent perspective views of an embodiment of a semiconductor device (or device) 200 according to various stages of the method 100 of FIG. 1. FIGS. 2B, 3B, 4B, 5B, and 6B are cross-sectional views taken in the X-Z plane along the A-A line in the corresponding figures numbered with suffix "A", which cut through a gate region and perpendicular to a lengthwise direction of channel regions of the device 200. FIGS. 7A, 8A, 9A, 10A, 11A, 12A, 13A, 14A, 15A, 16A, 17A, and 18A are cross-sectional views of the device 200 as in FIG. 6A taken in the Y-Z plane along the B-B line in subsequent stages of the method 100 of FIG. 1, which cuts through a channel region and adjacent source/drain regions located in a region I for high-performance functions. FIGS. 7B, 8B, 9B, 10B, 11B, 12B, 13B, 14B, 15B, 16B, 17B, and 18B are cross-sectional views of the device 200 as in FIG. 6A taken in the Y-Z plane along the C-C line in subsequent stages of the method 100 of FIG. 1, which cuts through a channel region and adjacent source/drain regions located in a region II for parasitic capacitance sensitive functions.

Figure 2B:
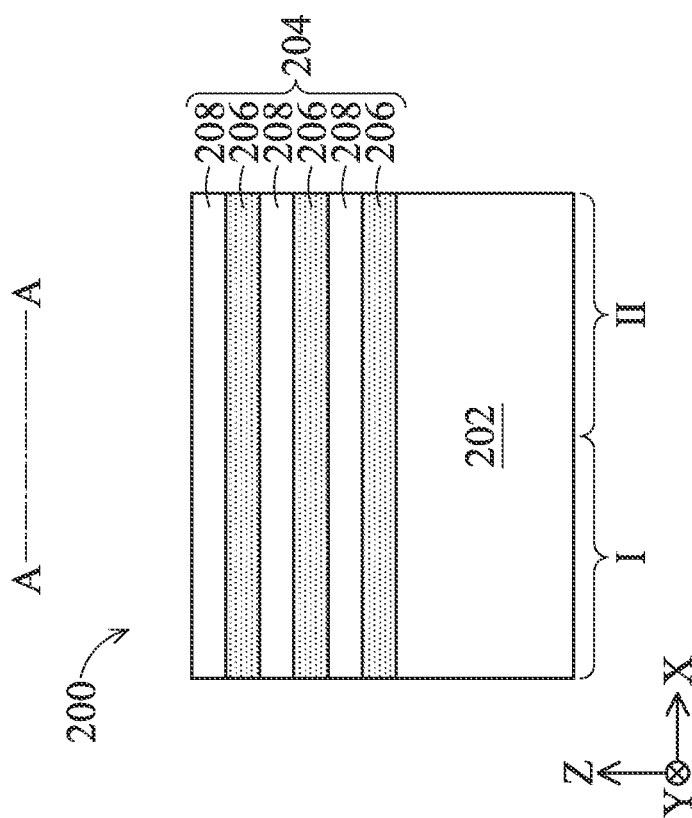
Figure 2A:
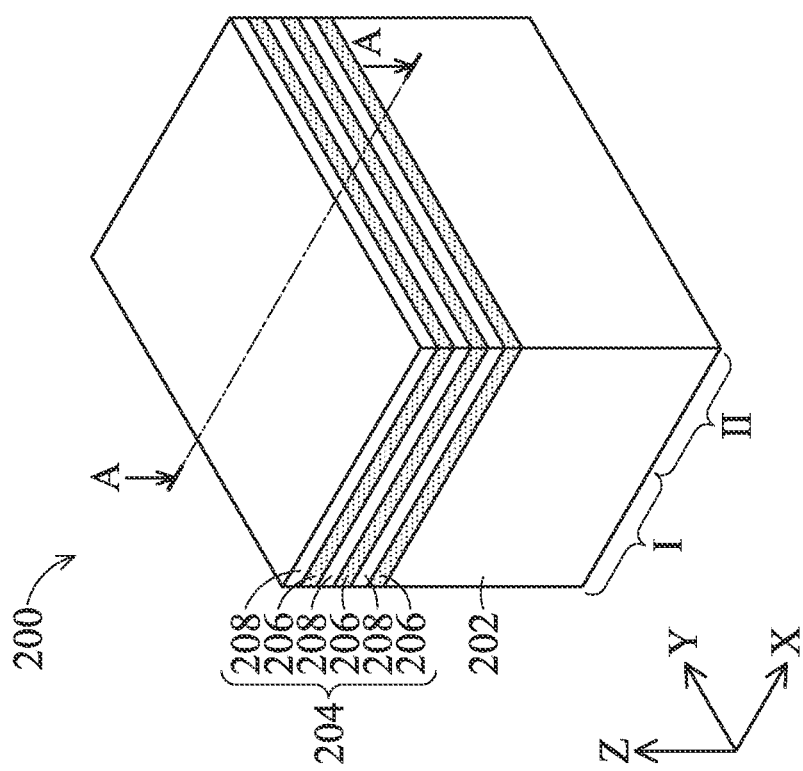
Figure 3B:
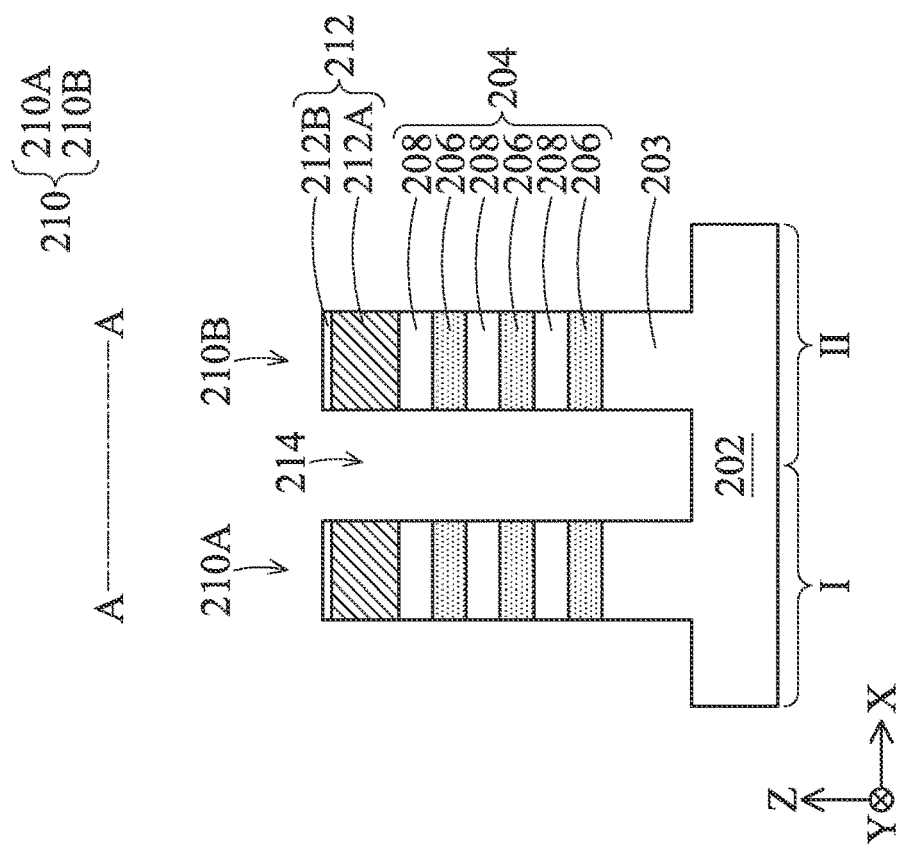
Figure 3A:
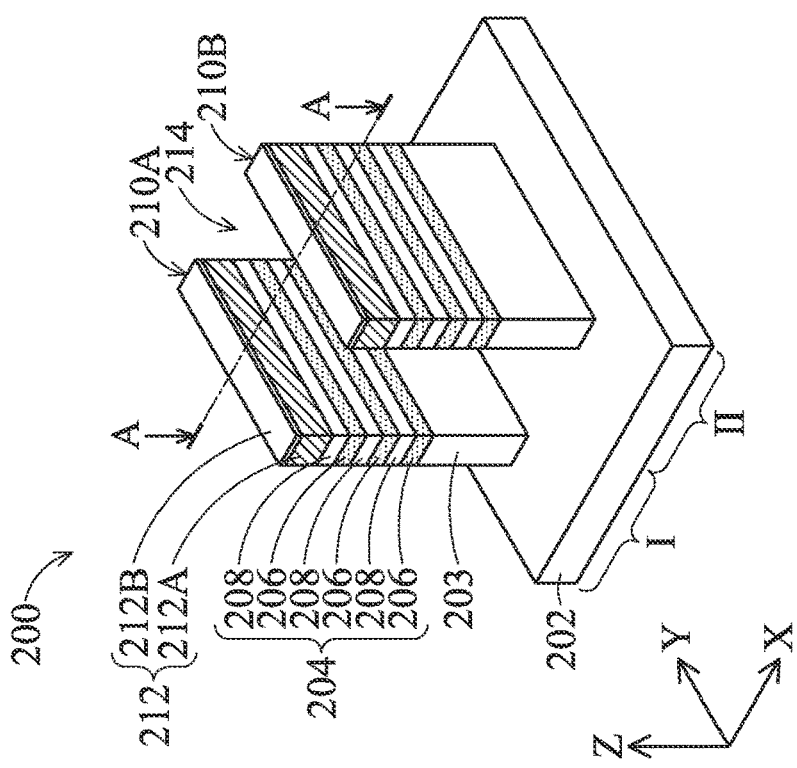

The method 100 at operation 102 (FIG. 1) provides (or is provided with) a device 200. Referring to FIGS. 2A and 2B, the device 200 includes a substrate 202 and an epitaxial stack 204 above the substrate 202. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various layers, including conductive or insulating layers formed on a semiconductor substrate. In the depicted embodiment, the substrate 202 includes a first region, denoted as region I, and a second region, denoted as region II. The region I may host high-performance circuits, such as high-performance computing (HPC) unit, central processing unit (CPU) logic circuits, memory circuits, and other core circuits for high-power applications. The region II may host high-speed circuits that are sensitive to parasitic capacitance, such as ring oscillator circuits. Generally, transistors in the region I due to their power-hungry applications need stronger current driving capability than transistors in the region II, such as more available active channel layers for current conduction. Transistors in the region II due to their sensitivity to parasitic capacitance need features that introduce less parasitic capacitance inside transistors, such as S/D epitaxial features with a lower profile and a smaller volume. Notably, although in the illustrate embodiment, the regions I and II are depicted as adjacent to each other, it is for illustrative purposes only. In various embodiments, the regions I and II may be adjacent to each other or separated from one another with one or more other regions disposed therebetween, so are the transistors formed in the regions I and II.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process. By way of example, epitaxial growth of the epitaxial layers 206 and 208 of the respective first and second compositions may be performed by a molecular beam epitaxy (MBE) process, a metalorganic chemical vapor deposition (MOCVD) process, and/or other suitable epitaxial growth processes. In various embodiments, the substrate 202 is a crystalline substrate, and the epitaxial layers 206 and 208 are crystalline semiconductor layers.

In some embodiments, each epitaxial layer 206 has a thickness ranging from about 4 nanometers (nm) to about 8 nm. The epitaxial layers 206 may be substantially uniform in thickness. In some embodiments, each epitaxial layer 208 has a thickness ranging from about 4 nm to about 8 nm. In some embodiments, the epitaxial layers 208 of the stack are substantially uniform in thickness. As described in more detail below, the epitaxial layers 208 or portions thereof may form channel layers (or channel members) of the to-be-formed multi-gate device 200 and the thickness is chosen based on device performance considerations. The term channel layer(s) (or channel member(s)) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel region(s) may eventually be removed and serve to define a vertical distance between adjacent channel members for a to-be-formed multi-gate device and the thickness is chosen based on device performance considerations. Accordingly, the epitaxial layers 206 may also be referred to as sacrificial layers, and the epitaxial layers 208 may also be referred to as channel layers.

It is noted that three (3) layers of the epitaxial layers 206 and three (3) layers of the epitaxial layers 208 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 204; the number of layers depending on the desired number of channels members for the device 200. In some embodiments, the number of epitaxial layers 208 is between 2 and 10. It is also noted that while the epitaxial layers 206, 208 are shown as having a particular stacking sequence, where an epitaxial layer 206 is the topmost layer of the epitaxial stack 204, other configurations are possible. For example, in some cases, an epitaxial layer 208 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

The method 100 then proceeds to operation 104 (FIG. 1) where semiconductor fins (also referred to as fins) are formed by patterning. With reference to the example of FIGS. 3A and 3B, in an embodiment of operation 104, a plurality of fins 210 (e.g., fin 210A in the region I and fin 210B in the region II) extending from the substrate 202 are formed. In various embodiments, each of the fins 210 includes a base portion 203 (also referred to as mesa) formed from the substrate 202 and an epitaxial stack portion 204 formed from portions of each of the epitaxial layers of the initial epitaxial stack including epitaxial layers 206 and 208. The fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the fins 210. In some embodiments, the HM layer 212 includes an oxide layer 212A (e.g., a pad oxide layer that may include silicon oxide) and a nitride layer 212B (e.g., a pad nitride layer that may include silicon nitride) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The fins 210 may subsequently be fabricated using suitable processes including photolithography and etching processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etching process forms trenches 214 in unprotected regions through the HM layer 212, through the epitaxial stack 204, and into the substrate 202, thereby leaving the plurality of extending fins 210. The trenches 214 may be etched using dry etching, wet etching, RIE, and/or other suitable processes.

Numerous other embodiments of methods to form fins on the substrate may also be used including, for example, defining the fin region (e.g., by mask or isolation regions)

and epitaxially growing the epitaxial stack 204 in the form of the fins 210. In some embodiments, forming the fins 210 may include a trim process to decrease the width of the fins 210. The trim process may include wet and/or dry etching processes.

Figure 4B:
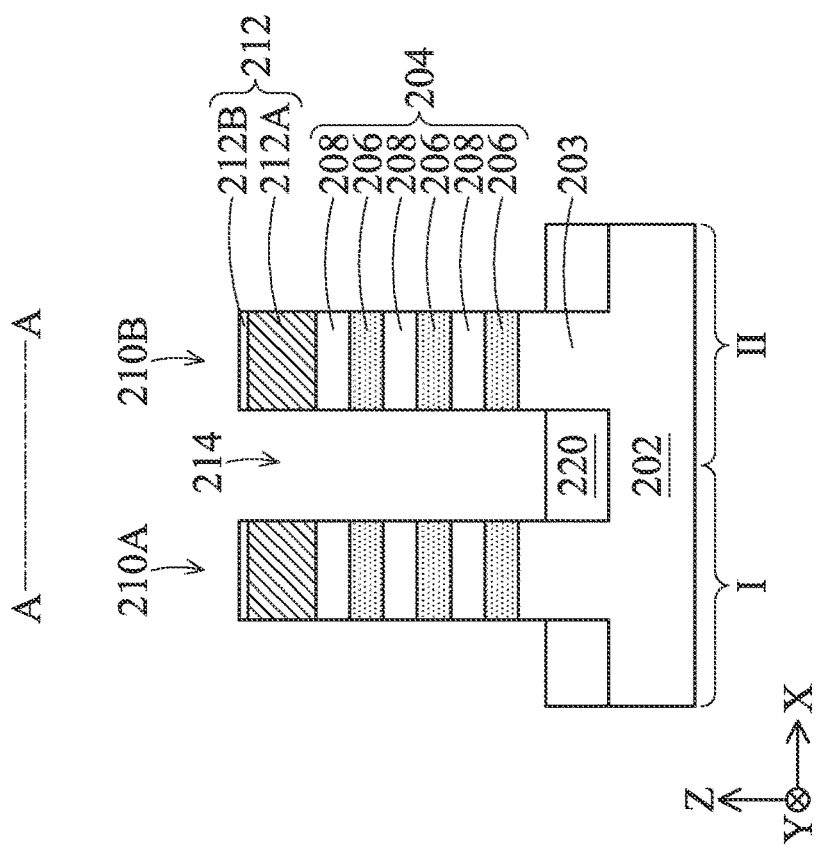
Figure 4A:
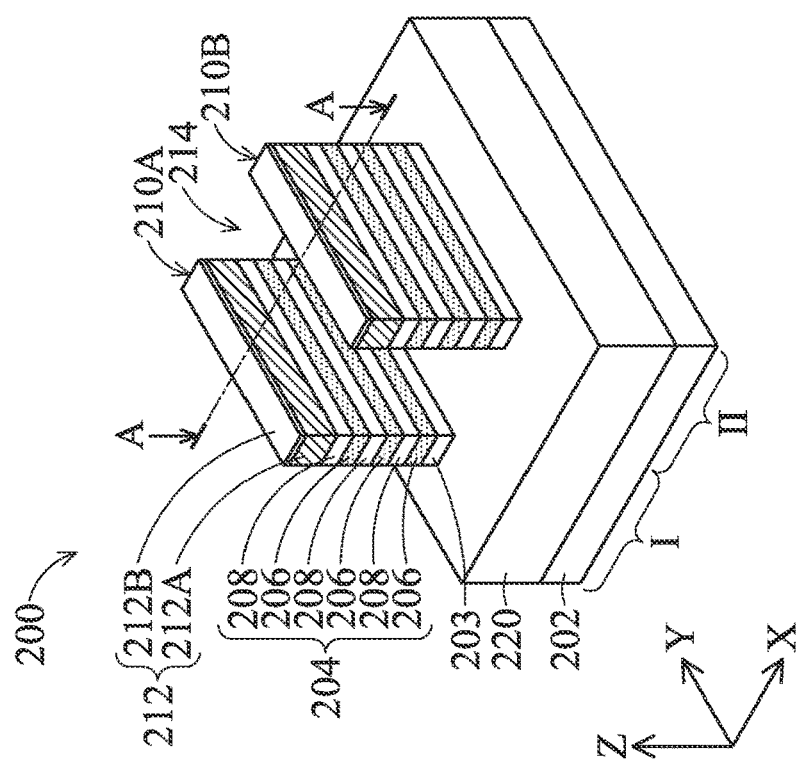

At operation 106, the method 100 (FIG. 1) forms an isolation feature, such as a shallow trench isolation (STI) feature, surrounding the fins 210. Referring to FIGS. 4A and 4B, an STI feature 220 is disposed on the substrate 202 interposing the fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers.

In some embodiments of forming the isolation (STI) feature, after deposition of the dielectric layer, the deposited dielectric material is thinned and planarized, for example by a chemical mechanical polishing (CMP) process. In some embodiments, the HM layer 212 functions as a CMP stop layer. Subsequently, the dielectric layer interposing the fins 210 are recessed. Still referring to the example of FIGS. 4A and 4B, the STI feature 220 is recessed providing the fins 210 extending through the STI feature 220. In some embodiments, the recessing process may include a dry etching process, a wet etching process, and/or a combination thereof. In some embodiments, a recessing depth is controlled (e.g., by controlling an etching time) so as to expose upper portion of the fins 210. In the illustrated embodiment, each layer of the epitaxial stack 204 is exposed. In furtherance of embodiments, a top surface of the STI feature 220 is recessed below the bottommost epitaxial layer 206. After the recessing process, the HM layer 212 may be removed, for example, by a wet etching process using $H_3PO_4$ or other suitable etchants.

Figure 5B:
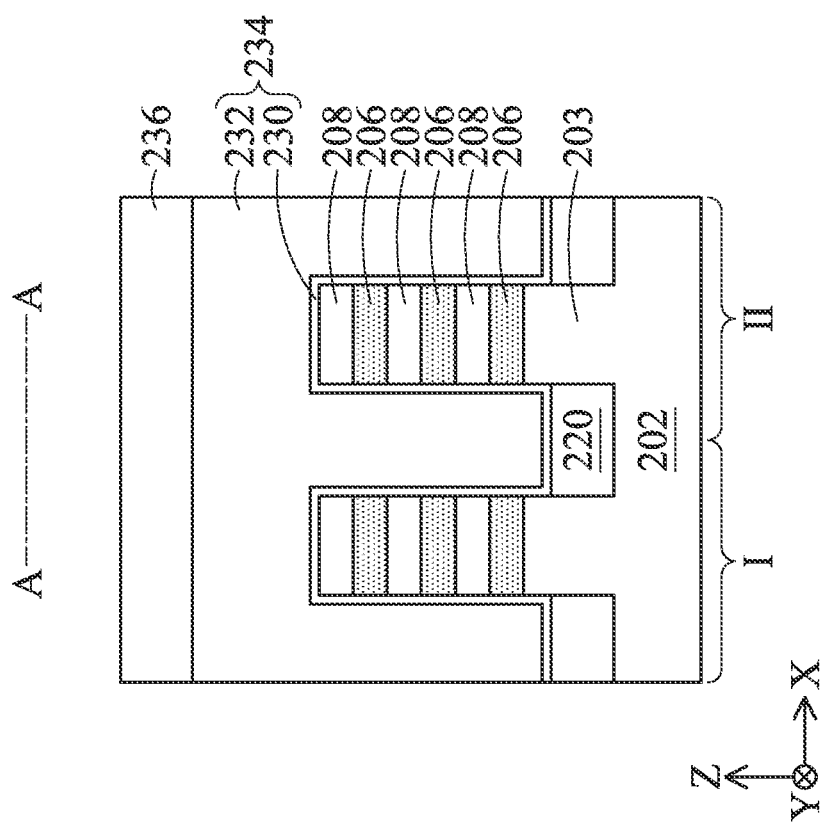
Figure 5A:
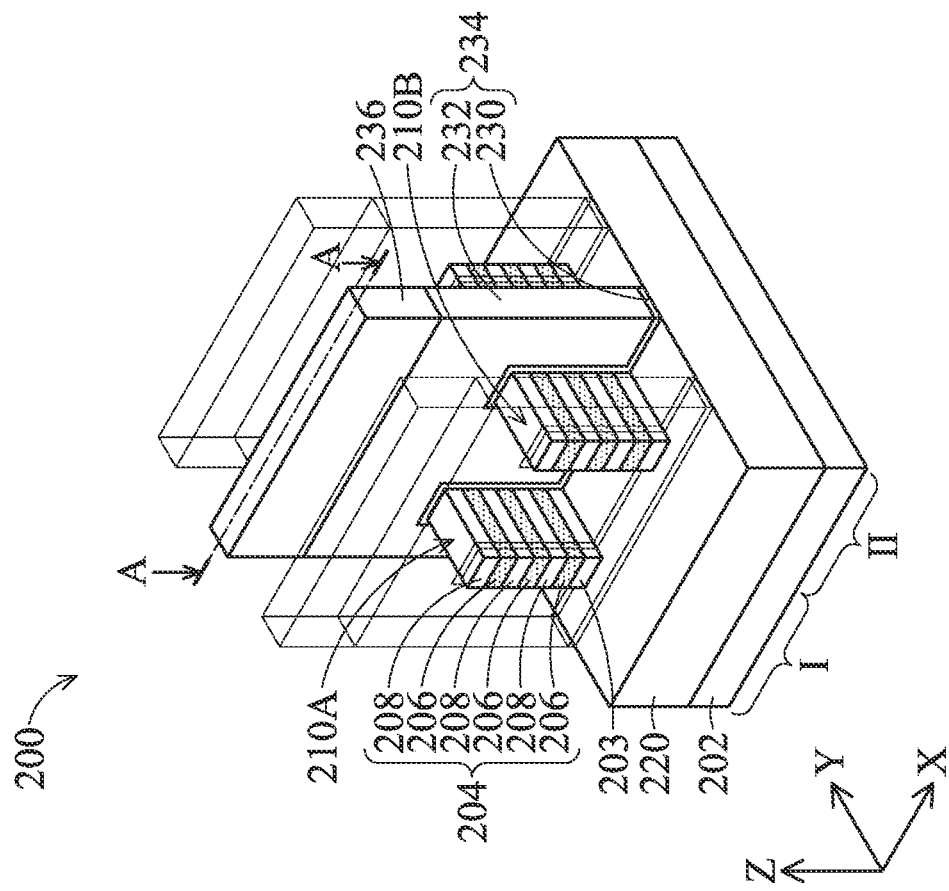
Figures 6A, 6B:
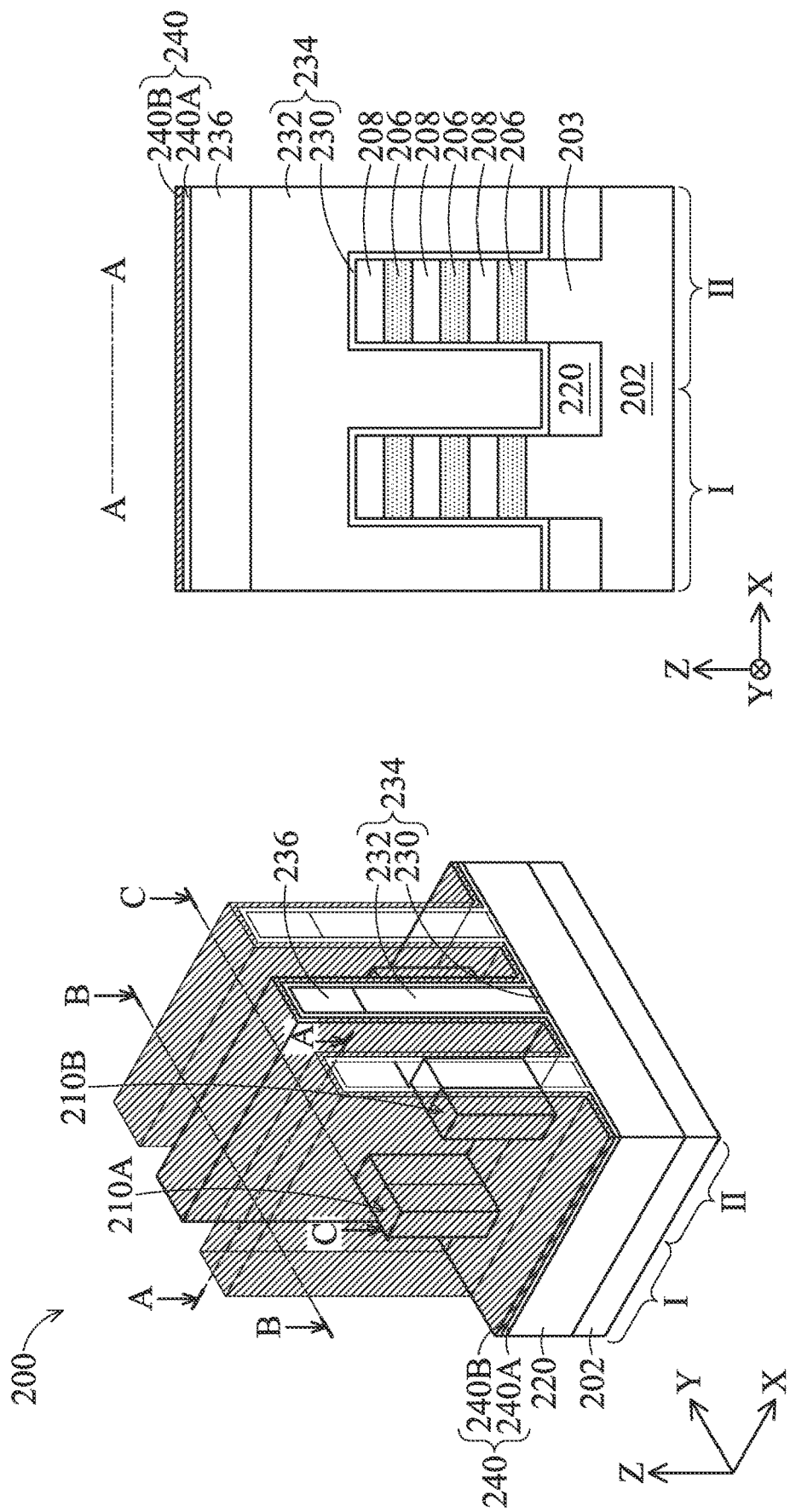
Figures 7A, 7B:
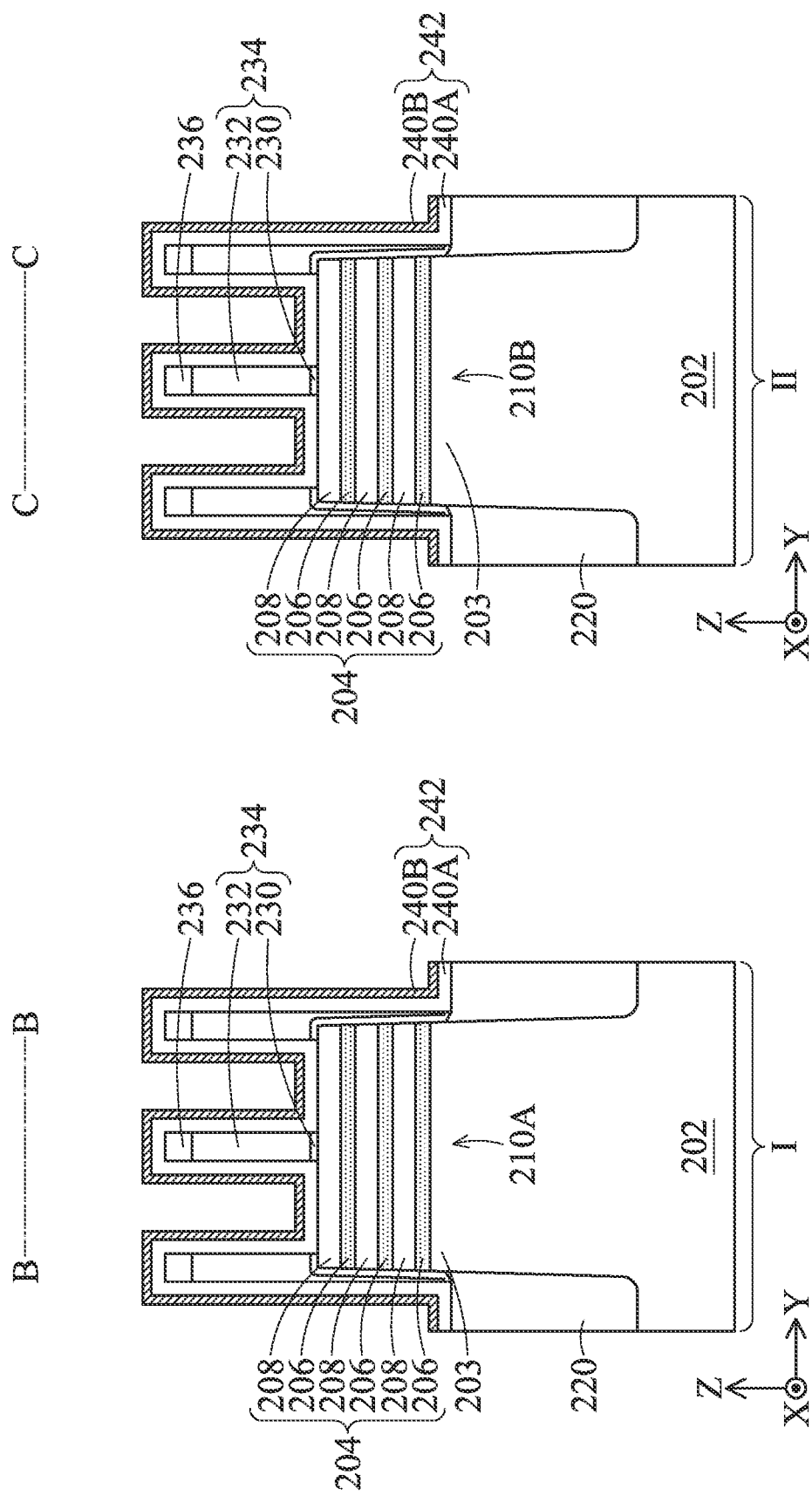

The method 100 then proceeds to operation 108 (FIG. 1) where dummy gate structures are formed. While the present discussion is directed to a replacement gate (or gate-last) process whereby dummy gate structures (or referred to as sacrificial gate structures) are formed and subsequently replaced, other configurations may be possible. With reference to FIGS. 5A and 5B, multiple dummy gate structures 234 are formed. Each of the dummy gate structures 234 will be replaced by a final gate stack at a subsequent processing stage of the method 100. In particular, the dummy gate structure 234 may be replaced at a later processing stage by a high-k dielectric layer (HK) and metal gate electrode (MG), as will be discussed in more detail below. In some embodiments, the dummy gate structures 234 are disposed over the fins 210 and the STI feature 220. The portions of the fins 210 underlying the dummy gate structures 234 may be referred to as channel regions. The dummy gate structures 234 may also define source/drain (S/D) regions of the fins 210, for example, the regions of a fin adjacent and on opposing sides of the respective channel region.

In some embodiments, the dummy gate structures 234 are formed by various process steps such as layer deposition, patterning, etching, as well as other suitable processing steps. Exemplary layer deposition processes include CVD (including low-pressure CVD, plasma-enhanced CVD, and/or flowable CVD), PVD, ALD, thermal oxidation, e-beam evaporation, or other suitable deposition techniques, or combinations thereof. In some embodiments, each of the dummy gate structures 234 includes a dummy dielectric layer 230 and a dummy electrode layer 232. In some embodiments, the dummy dielectric layer 230 may include $SiO_2$, silicon nitride, a high-k dielectric material and/or other suitable material. Subsequently, the dummy electrode layer 232 is deposited. In some embodiments, the dummy electrode layer 232 may include polycrystalline silicon (polysilicon). In forming the dummy gate structure 234 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate structures 234 are patterned through a hard mask 236. The hard mask 236 may include multiple layers, such as an oxide layer and a nitride layer over the oxide layer. In some embodiments, after formation of the dummy gate structures 234, the dummy dielectric layer 230 is removed from the S/D regions of the fins 210. The etching process may include a wet etch, a dry etch, and/or a combination thereof. The etching process is chosen to selectively etch the dummy dielectric layer 230 without substantially etching the fins 210, the hard mask 236, and the dummy electrode layer 232.

At operation 110, the method 100 (FIG. 1) deposits a blanket layer on top and sidewall surfaces of the dummy gate structures 234 and top and sidewall surfaces of the fins 210. With reference to FIGS. 6A, 6B, 7A, and 7B, after the dummy gate structures 234 are formed, a blanket layer 240 of an insulating material for forming gate sidewall spacers in subsequent processes is conformally deposited by using CVD, ALD, or other suitable methods. The blanket layer 240 is deposited in a conformal manner so that it is formed to have substantially equal thicknesses on various surfaces, such as the sidewalls, horizontal surfaces, and the top of the dummy gate structures. In some embodiments, the blanket layer 240 is deposited to a thickness in a range from about 2 nm to about 10 nm. In the illustrated embodiment, the blanket layer 240 includes a first layer 240A of an oxide (e.g., silicon oxide) and a second layer 240B of a nitride-based material, such as SiN, SiON, SiOCN or SiCN and combinations thereof, disposed on the first layer 240A.

At operation 112, the method 100 (FIG. 1) selectively etches the blanket layer 240 to remove horizontal portions while leaving vertical portions on opposite sidewalls of the dummy gate structures 234 as gate sidewall spacers. With reference to FIGS. 8A and 8B, in some embodiments, the blanket layer 240 is etched using an anisotropic process to form gate sidewall spacers 242 on opposite sidewalls of the dummy gate structure 234. The anisotropic etching performed on the blanket layer 240 can be, for example, reactive ion etching (RIE). During the anisotropic etching process, most of the insulating material is removed from horizontal surfaces, leaving the dielectric spacer layer on the vertical surfaces such as the sidewalls of the dummy gate structures 234.

At operation 114, the method 100 (FIG. 1) deposits a patterned mask layer covering the region II and recesses the fin 210A in the region I in forming S/D recesses. With reference to FIGS. 9A and 9B, a patterned mask layer 252 covers the region II with openings exposing the region I. In some embodiments, the patterned mask layer 252 is a hard mask layer comprising a single layer or a multi-layer. For example, the hard mask layer may include a silicon oxide layer and a silicon nitride layer over the silicon oxide layer. The hard mask layer may be formed using chemical vapor deposition (CVD), low-pressure CVD (LPCVD), plasma-enhanced CVD (PECVD), physical vapor deposition (PVD), atomic layer deposition (ALD), thermal oxidation, electron-beam (e-beam) evaporation, or other suitable deposition techniques, or combinations thereof. The hard mask layer is patterned using any suitable methods such as a photolithography process, which may include forming a resist layer on the hard mask layer, exposing the resist by a lithography exposure process, performing a post-exposure bake process, developing the photoresist layer to form the patterned photoresist layer that exposes part of the hard mask layer, patterning the hard mask layer, and finally removing the patterned resist layer. The lithography process may be alternatively replaced by other suitable techniques, such as e-beam writing, ion-beam writing, maskless patterning or molecular printing.

In some embodiments, the patterned mask layer 252 is a resist layer, such as a tri-layer resist layer that includes a bottom layer, a middle layer, and a top photoresist layer. In furtherance of embodiments, the bottom layer may include a carbon rich polymer material (e.g., $C_xH_yO_z$), the middle layer may include a silicon rich polymer material (e.g., $SiC_xH_yO_z$), and the top photoresist layer may include a carbon rich polymer material (e.g., $C_xH_yO_z$) with a photosensitive component that undergoes a property change when exposed to radiation. The patterning of the top photoresist layer may be achieved, for example, by using an immersion photolithography system to expose portions of the top photoresist layer and developing the exposed or unexposed portions depending on whether a positive or negative photoresist is used. The middle layer is then etched through the openings in the top photoresist layer. In this manner, the top photoresist layer serves as an etch mask limiting the etching process in the region I. The bottom layer is subsequently etched through the openings in the top photoresist layer and the middle layer. In this manner, the top photoresist layer and the middle layer collectively serve as an etch mask limiting the etching process in the region I.

Still referring to FIGS. 9A and 9B, the fin 210A in the region I is subsequently recessed in forming S/D recesses. In some embodiment, a source/drain etching process is performed to form the S/D recesses 246A by removing portions of the fin 210A not covered by the dummy gate structure 234 (e.g., in source/drain regions) and that were previously exposed (e.g., during the blanket layer 240 etch-back process). In particular, the source/drain etching process may serve to remove the exposed epitaxial layer portions 206 and 208 in source/drain regions of the device 200 to expose the base portion 203 of the fin 210A. In some embodiments, the source/drain etching process may include a dry etching process, a wet etching process, and/or a combination thereof. In some embodiments, a recessed depth is controlled (e.g., by controlling an etching time) such that the top surface of the base portion 203 is recessed to be under the top surface of the STI feature 220 directly under the gate sidewall spacers 242, such as for about 2 nm to about 5 nm in some examples. Due to the limited etch contrast between material compositions of the fin 210A and the STI feature 220, the top surface of the STI not protected under the gate sidewall spacers 242 may also be recessed during the source/drain etching process for a vertical distance $\Delta H_1$, such as about 10 nm to about 100 nm. At the conclusion of operation 114, the patterned mask layer 252 is removed from the region II in an etching process, an ashing process, or other suitable removal processes.

At operation 116, the method 100 (FIG. 1) deposits a patterned mask layer covering the region I and recesses the fin 210B in the region II in forming S/D recesses. With reference to FIGS. 10A and 10B, a patterned mask layer 252' covers the region I with openings exposing the region II. In some embodiments, the patterned mask layer 252' is substantially similar to what has been discussed above in association with the patterned mask layer 252. In one example, the patterned mask layer 252' is a hard mask layer comprising a single layer or a multi-layer. In another example, the patterned mask layer 252' is a resist layer, such as a tri-layer resist layer.

Subsequently, the fin 210B in the region II is recessed in forming S/D recesses. In some embodiment, a source/drain etching process is performed to form the S/D recesses 246B by removing portions of the fin 210B not covered by the dummy gate structure 234 (e.g., in source/drain regions) and that were previously exposed (e.g., during the blanket layer 240 etch-back process). In some embodiments, the source/drain etching process may include a dry etching process, a wet etching process, and/or a combination thereof. A recessed depth is controlled (e.g., by controlling an etching time) such that top portions of the epitaxial layers 206 and 208 in source/drain regions of the device 200 are removed, while bottom portions of the epitaxial layers 206 and 208 may partially remain. In other words, the S/D recesses 246A have a higher aspect ratio than the S/D recesses 246B.

For example, the etching time applied at the region II may be shorter than the etching time applied at the region I. In the illustrated embodiment, the bottommost epitaxial layer 208 is partially recessed, while the bottommost epitaxial layer 206 and the base portion 203 remain covered by remaining portion of the bottommost epitaxial layer 208 and not exposed in the S/D recesses 246B. In some embodiments, the bottommost epitaxial layer 206 is exposed and partially recessed, while the base portion 203 remains covered by remaining portion of the bottommost epitaxial layer 206 and not exposed in the S/D recesses 246B. That is, at least the top surface of the base portion 203 remains intact and above the top surface of the STI feature 220 directly under the gate sidewall spacers 242. Other than applying different etching durations at the regions I and II, the source/drain etching processes at the regions I and II may be different, such as by having different etching parameters. In one example, the source/drain etching process applied at the region I includes applying an etchant (e.g., a mixture of HBr, He, $CH_4$) with a relatively lower pressure (e.g., from about 3 mTorr to about 20 mTorr) and a relatively higher bias power (e.g., from about 500 W to about 1500 W) for a relatively longer duration (e.g., from about 100 s to about 300 s); the source/drain etching process applied at the region II includes applying an etchant (e.g., a mixture of HBr, He, $CH_4$) with a relatively higher pressure (e.g., from about 20 mTorr to about 50 mTorr) and a relatively lower bias power (e.g., from about 100 W to about 500 W) for a relatively shorter duration (e.g., from about 50 s to about 100 s).

Due to the limited etching contrast between material compositions of the fin 210B and the STI feature 220, the top surface of the STI not protected under the gate sidewall spacers 242 may also be recessed during the source/drain etching process for a vertical distance $\Delta H_2$, such as about 5 nm to about 50 nm. Due to the shorter etching time, $\Delta H_2$ is smaller than $\Delta H_1$, such as for about 5 nm to about 50 nm. Accordingly, the exposed top surface of the STI feature 220 in the region II is higher than in the region I, such as for about 5 nm to about 50 nm. At the conclusion of operation 116, the patterned mask layer 252' is removed from the region I in an etching process, an ashing process, or other suitable removal processes.

Notably, although FIGS. 9A, 9B, 10A, and 10B illustrate the region I as the region receiving the source/drain etching process prior to the region II, it is understood that an alternative embodiment of having the region II as the one receiving the source/drain etching process prior to the region I is equally applicable. That is, operation 116 may be performed prior to operation 114.

Figure 11A:
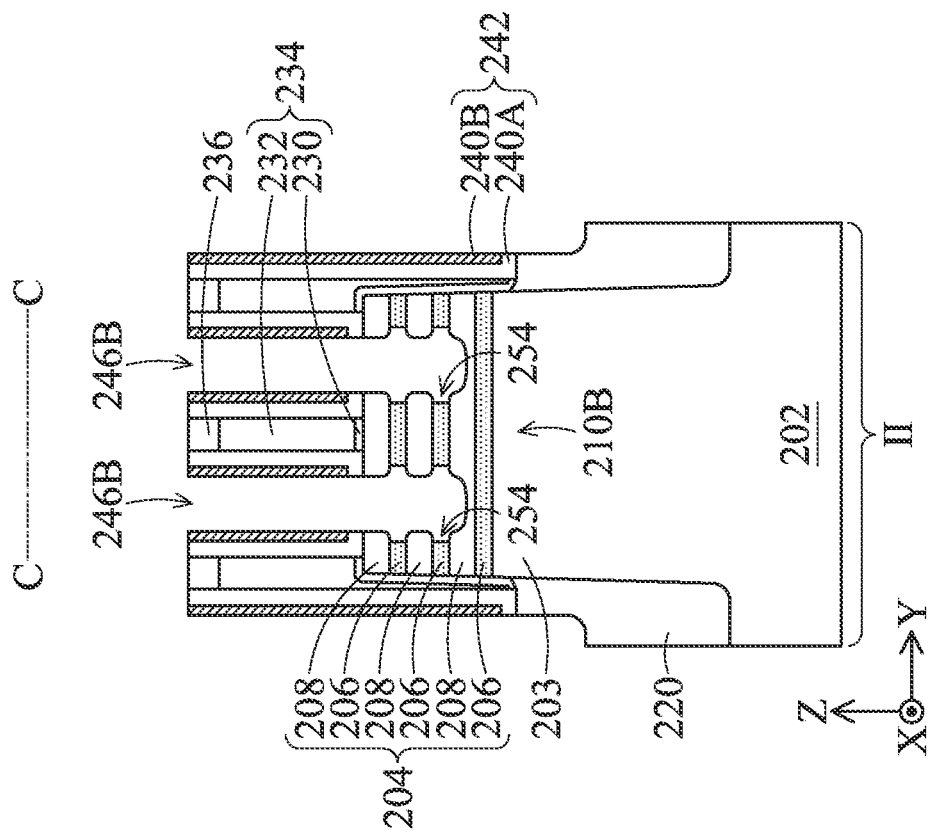
Figure 11B:
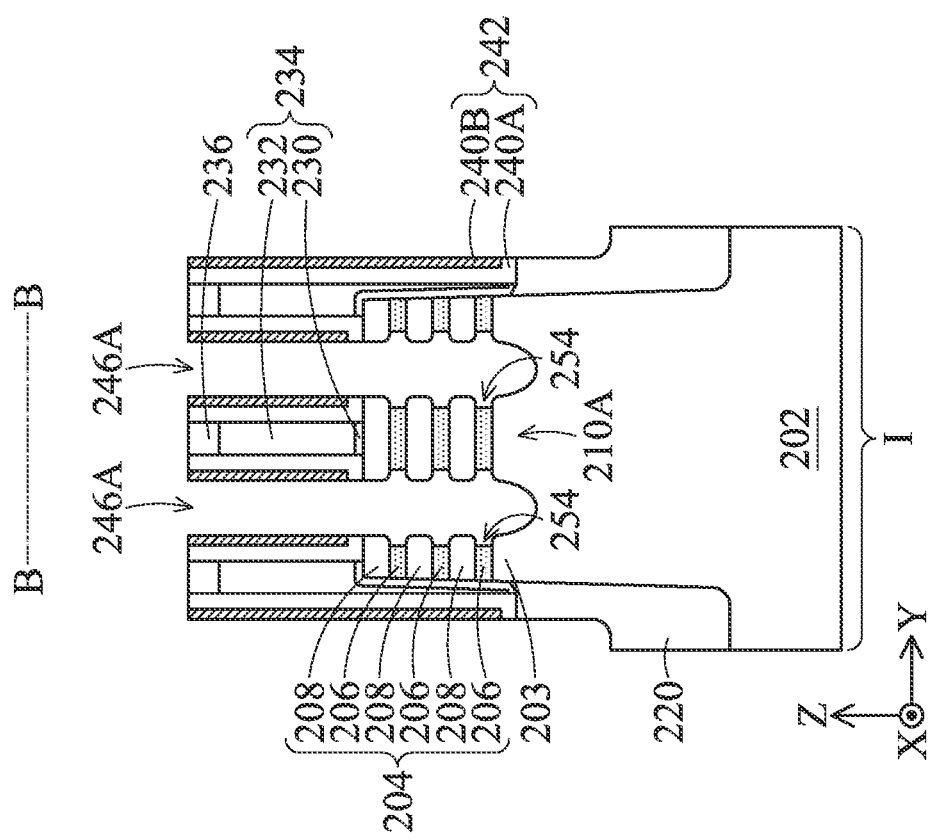

At operation 118, the method 100 (FIG. 1) laterally recesses epitaxial layers 206 that are exposed in the S/D recesses in both the regions I and II to form inner spacer cavities. With reference to FIGS. 11A and 11B, inner spacer cavities 254 are formed by laterally recessing the epitaxial layers 206 through S/D recesses 246A and 246B. In some embodiments of operation 118, a lateral etching (or horizontal recessing) is performed to recess the epitaxial layers 206 to form inner spacer cavities 254. The amount of etching of the epitaxial layers 206 is in a range from about 2 nm to about 10 nm in some embodiments. When the epitaxial layers 206 are SiGe, the lateral etching process may use an etchant selected from, but not limited to, ammonium hydroxide ($NH_4OH$), tetramethylammonium hydroxide (TMAH), ethylenediamine pyrocatechol (EDP), and potassium hydroxide (KOH) solutions. In the illustrated embodiment, no inner spacer cavities 254 are formed on terminal (lateral) ends of the bottommost epitaxial layer 206 in the region II as the remaining portion of the bottommost epitaxial layer 208 protects the bottommost epitaxial layer 206 from receiving the lateral etching process.

Figures 13A, 13B:
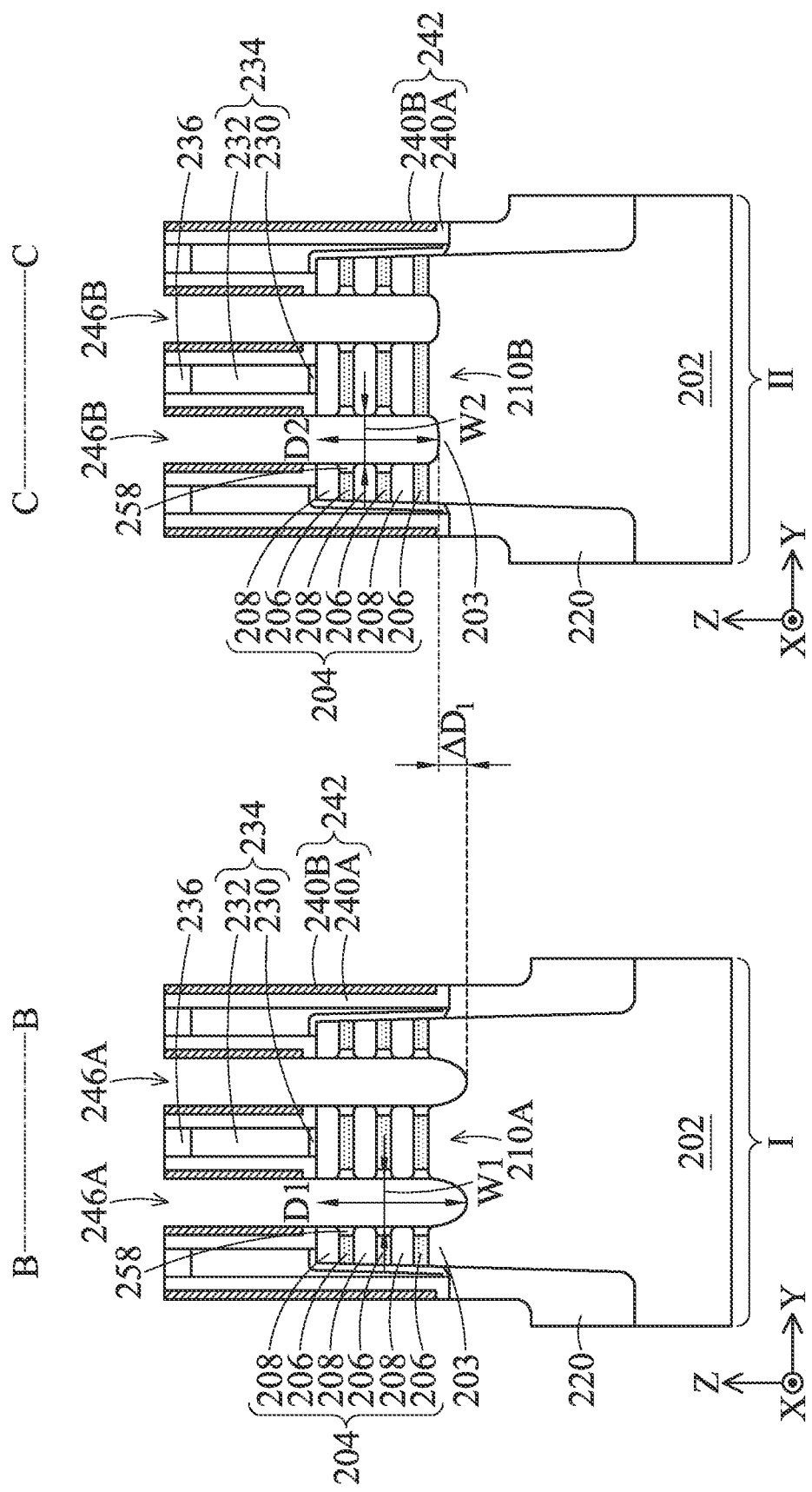

At operation 120, the method 100 (FIG. 1) forms inner spacers in the inner spacer cavities. With reference to FIGS. 12A and 12B, an insulating layer 256 is formed on the lateral ends of the epitaxial layers 206 to fill the inner spacer cavities 254. The insulating layer 256 may include a dielectric material, such as SiN, SiOC, SiOCN, SiCN, $SiO_2$, and/or other suitable material. In some embodiments, the insulating layer 256 is conformally deposited in the S/D recesses 246A and 246B, for example, by ALD or any other suitable method. With reference to FIGS. 13A and 13B, after the conformal deposition of the insulating layer 256, an etch-back process is performed to partially remove the insulating layer 256 from outside of the inner spacer cavities 254. After the etch-back process, portions of the insulating layer 256 remain substantially within the inner spacer cavities 254 as the inner spacers 258. Due to limited etching contrast, the etch-back process may also remove the exposed portions of the bottommost epitaxial layer 208 in exposing the bottommost epitaxial layer 206 in the S/D recesses 246B, and further remove the exposed portion of the bottommost epitaxial layer 206 in the S/D recesses 246B in exposing the base portion 203 in the region II. A top surface of the base portion 203 exposed in the S/D recesses 246B may be slightly recessed. The recessed top surface of the base portion 203 may still be above the top surface of the STI feature 220 directly under the gate sidewall spacers 242 in some embodiments. Alternatively, the recessed top surface of the base portion 203 may be below the top surface of the STI feature 220 directly under the gate sidewall spacers 242 in some embodiments. The terminal ends of the bottommost epitaxial layer 206 are exposed in the region II. The bottommost epitaxial layer 206 in the region II has a length larger than other epitaxial layers 206 thereabove.

In various embodiments, the depth D1 (vertical distance from exposed top surface of the base portion 203 to the top surface of the epitaxial stack 204) and width W1 (measured at half depth) of the S/D recesses 246A in the region I are larger than the depth D2 and width W2 of the S/D recesses 246B in the region II, respectively, and the aspect ratio (D1/W1) of the S/D recesses 246A is also larger than the aspect ratio (D2/W2) of the S/D recesses 246B in the region II. The depth D1 may range from about 30 nm to about 90 nm, and the depth D2 may range from about 10 nm to about 60 nm, in some embodiments. Due to the larger D1, a bottom surface (the recessed top surface of the base portion 203) of the S/D recesses 246A is below a bottom surface of the S/D recesses 246B for a vertical distance $\Delta D_1$, which ranges from about 20 nm to about 30 nm in some embodiments. Due to the larger W1, lengths of the epitaxial layers 208 (channel layers) in the region I are generally smaller than in the region II, such as from about 26 nm to about 32 nm in the region I and from about 29 nm to about 35 nm in the region II.

Figures 14A, 14B:
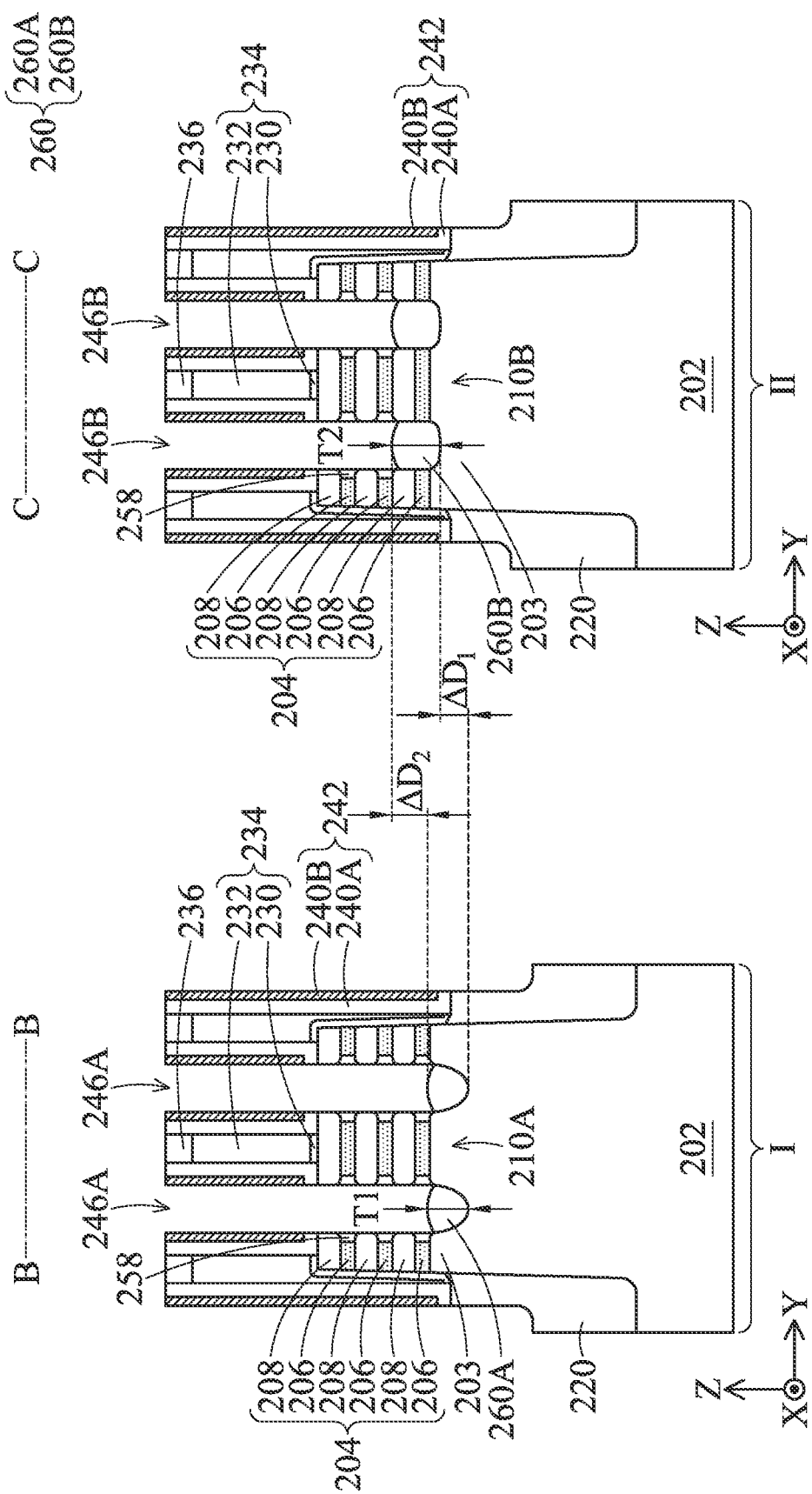

At operation 122, the method 100 (FIG. 1) forms a buffer layer 260A at the bottom of the S/D recesses 246A in the region I and a buffer layer 260B at the bottom of the S/D recesses 246B in the region II, such as shown in FIGS. 14A and 14B. Collectively, the buffer layers 260A and 260B are referred to as the buffer layer 260. In some embodiments, the buffer layer 260 is formed by depositing a dielectric material, such as a nitride or an oxide, in the S/D recesses 246A and 246B. In some embodiments, the buffer layer 260 is formed by epitaxially growing semiconductor material in the S/D recesses 246A and 246B. Epitaxially grown buffer layer 260A is also referred to as buffer epitaxial layer 260A, epitaxially grown buffer layer 260B is also referred to as buffer epitaxial layer 260B, and the buffer layer 260 is also referred to as buffer epitaxial layer 260 or lower epitaxial layer 260. By way of example, epitaxial growth of the buffer epitaxial layer 260 may be performed by vapor-phase epitaxy (VPE), ultra-high vacuum CVD (UHV-CVD), molecular beam epitaxy (MBE), and/or other suitable processes. In some embodiments, the buffer epitaxial layer 260 includes the same material as the substrate 202, such as silicon (Si). In some alternative embodiments, the buffer epitaxial layer 260 includes a different semiconductor material than the Si substrate 202, such as SiGe, SiSn, or other suitable semiconductor material. In some embodiments, the buffer epitaxial layer 260 is dopant-free, where for example, no intentional doping is performed during the epitaxial growth process. Therefore, the buffer epitaxial layer 260 may also be referred to as undoped epitaxial layer 260. Further, a term "undoped layer" or "undoped feature" covers both undoped epitaxial material and dielectric material. As a comparison, in one instance, the substrate 202 is lightly doped and has a higher doping concentration than the buffer epitaxial layer 260. The buffer epitaxial layer 260 provides a high resistance path from the S/D regions to the semiconductor substrate, such that the leakage current in the semiconductor substrate (i.e., through the base portion 203) is suppressed. The inner spacers 258 limit the vertical growth of the buffer epitaxial layer 260, as the epitaxial growth may not take place from a dielectric surface. The buffer epitaxial layer 260 exhibits faceted growth when it reaches the inner spacers 258, such that the top surface of the epitaxial layer 260 has a concave shape. Thus, the buffer epitaxial layer 260 may partially overlap with a bottom portion of the bottommost inner spacers 258 but do not grow vertically beyond a top portion of the bottommost inner spacers 258.

Due to the different profiles of the S/D recesses 246A and 246B, the buffer epitaxial layer 260 has different profiles and volumes in the S/D recesses 246A and 246B. For example, in the region I, the bottommost inner spacers 258 isolate the buffer epitaxial layer 260A from contacting the bottommost epitaxial layer 206; in the region II, the buffer epitaxial layer 260B is in physical contact with the terminal ends of both the bottommost epitaxial layer 206 and the bottommost epitaxial layer 208. Further, a bottom surface of the buffer epitaxial layer 260A in the region I is below a bottom surface of the buffer epitaxial layer 260B in the region II for the vertical distance $\Delta D_1$, which ranges from about 20 nm to about 30 nm in some embodiments. A top surface of the buffer epitaxial layer 260A in the region I is below a top surface of the buffer epitaxial layer 260B in the region II for the vertical distance $\Delta D_2$, which ranges from about 10 nm to about 20 nm in some embodiments. Overall, the thickness T1 of the buffer epitaxial layer 260A in the region I is still larger than the thickness T2 of the buffer epitaxial layer 260B in the region II. In some embodiments, the thickness T1 ranges from about 20 nm to about 50 nm, and the thickness T2 ranges from about 10 nm to about 30 nm. The width and volume of the buffer epitaxial layer 260A in the region I are also larger than the width and volume of the buffer epitaxial layer 260B in the region II, respectively. Due to the larger volume of the epitaxial layer 260A in the region I than the epitaxial layer 260B in the region II, a height of the concave profile (measured from a tip of the concave profile to where the facet intersects the inner spacer sidewall) in the region I may be also larger than in the region II, such as ranging from about 3 nm to about 6 nm in the region I and from about 1 nm to about 3 nm in the region II.

Figures 15A, 15B:
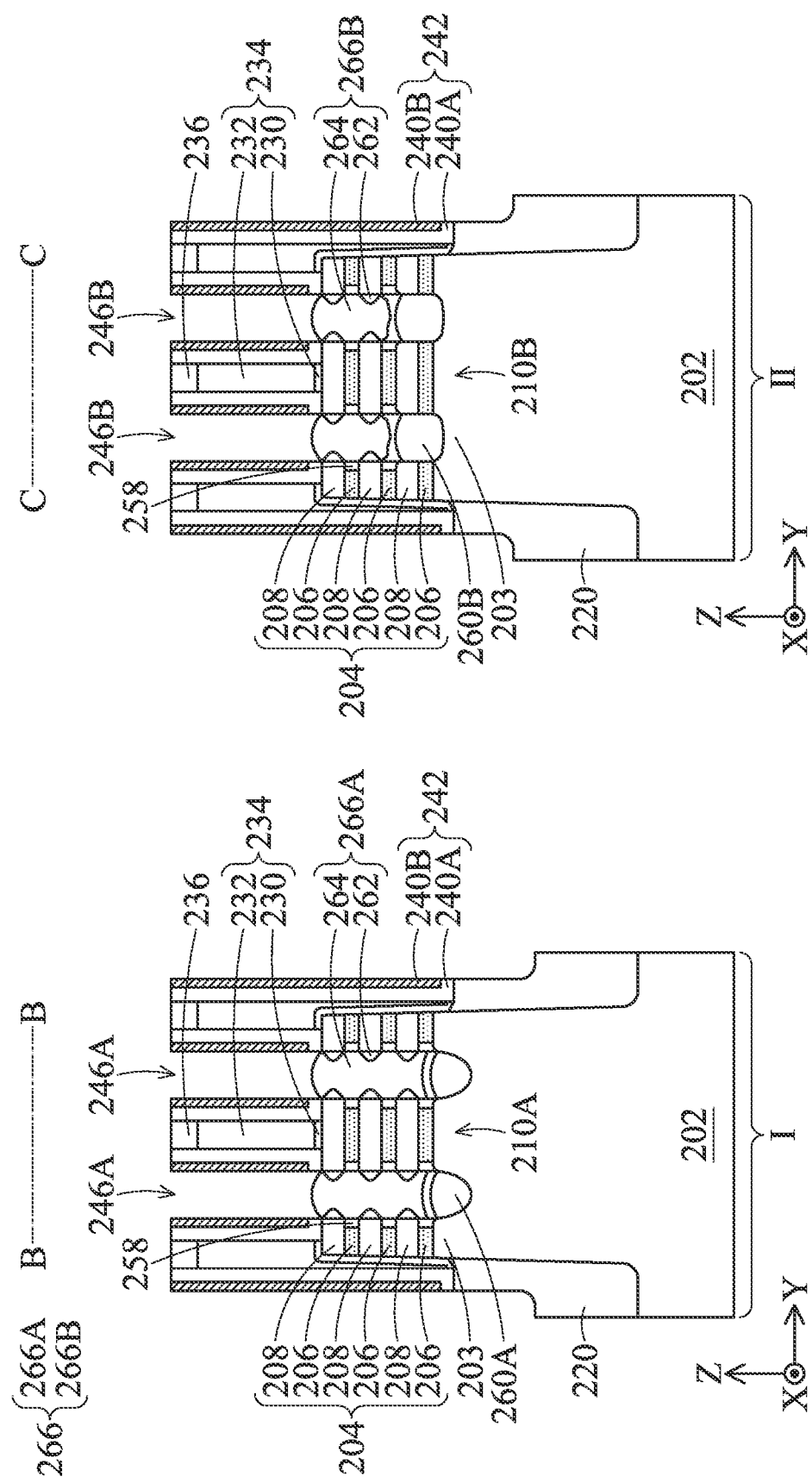

At operation 124, the method 100 (FIG. 1) forms epitaxial features 266A over the buffer epitaxial layer 260A in the S/D recesses 246A and epitaxial features 266B over the buffer epitaxial layer 260B in the S/D recesses 246B, such as shown in FIGS. 15A and 15B. Collectively, the epitaxial features 266A and 266B are referred to as the epitaxial features 266. The epitaxial features 266 may also be referred to as the upper epitaxial layer 266, as being positioned above the lower epitaxial layer 260. The epitaxial features 266 may also be referred to as S/D epitaxial features. Sometimes, the term "S/D epitaxial features" includes the upper epitaxial layer 266 and the lower epitaxial layer 260 underneath. Each of the epitaxial features 266 includes a first doped epitaxial layer 262 and a second doped epitaxial layer 264 over the first doped epitaxial layer 262. The first doped epitaxial layer 262 makes contact with the lateral ends of the epitaxial layers 208 and in contact with the buffer epitaxial layer 260. The second doped epitaxial layer 264 covers the first doped epitaxial layer 262 and is in contact with the inner spacers 258. In an embodiment, forming the doped epitaxial layers 262 and 264 includes epitaxially growing the semiconductor layers by an MBE process, a chemical vapor deposition process, and/or other suitable epitaxial growth processes. In a further embodiment, the doped epitaxial layers 262 and 264 are in-situ or ex-situ doped with dopant(s). For example, the doped epitaxial layers 262 and 264 may include silicon doped with phosphorous or arsenic for n-type devices. Alternatively, the doped epitaxial layers 262 and 264 may include silicon germanium doped with boron for p-type devices. In some embodiments, the first doped epitaxial layer 262 includes the same dopant species as the second doped epitaxial layer 264. In some embodiments, the first doped epitaxial layer 262 includes a different dopant species from the second doped epitaxial layer 264. For example, the first doped epitaxial layer 262 may include silicon doped with arsenic, and the second doped epitaxial layer 264 may include silicon doped with phosphorous. In various embodiments, the dopant concentration is increasingly grading from the first doped epitaxial layer 262 to the second doped epitaxial layer 264, which facilitate subsequent silicidation process (e.g., nickel silicide formation) for landing S/D contacts on the S/D epitaxial features. Further, the first doped epitaxial layer 262 and the second doped epitaxial layer 264 may include a constant distribution of dopant concentration individually in some embodiments. For example, the second doped epitaxial layer 264 includes a constant distribution where the dopant concentration is constant from its bottommost to its topmost but larger than that of the first doped epitaxial layer 262.

Since the S/D recesses 246B in the region II is shallower than the S/D recesses 246A, the growth of the epitaxial features 266B fills the S/D recesses 246B faster than the epitaxial features 266A and further grows upwardly given the same epitaxial growth time. Yet, the gate sidewall spacers 242 limit the vertical growth of the epitaxial features 266, as the epitaxial growth may not take place from a dielectric surface. Accordingly, a topmost portion of the epitaxial features 266B may only be slightly higher than a topmost portion of the epitaxial feature 266A, but a volume of the epitaxial features 266B is much smaller than a volume of the epitaxial features 266A, as a bottom surface of the epitaxial features 266B is higher than a bottom surface of the epitaxial features 266A. Further, a width and an aspect ratio of the epitaxial features 266B are also less than a width and an aspect ratio of the epitaxial features 266A, respectively. The relatively smaller height (thickness), width, and volume of the epitaxial features 266B translate to less parasitic capacitance in the region II.

At operation 126, the method 100 (FIG. 1) forms a contact etch stop layer (CESL) 270 and an inter-layer dielectric (ILD) layer 272 over the CESL 270, such as shown in FIGS. 16A and 16B. The CESL 270 is deposited over the epitaxial features 266, the gate sidewall spacers 242, and the STI features 220. The ILD layer 272 is deposited over the CESL 270. In some embodiments, the CESL 270 includes a silicon nitride layer, silicon oxide layer, a silicon oxynitride layer, and/or other materials known in the art. The CESL 270 may be formed by plasma-enhanced chemical vapor deposition (PECVD) process and/or other suitable deposition or oxidation processes. In some embodiments, the ILD layer 272 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 272 may be deposited by a PECVD process or other suitable deposition technique. In some embodiments, after formation of the ILD layer 272, the device 200 may be subject to a high thermal budget process to anneal the ILD layer 272.

After depositing the ILD layer 272, a planarization process may be performed to remove excessive dielectric materials. For example, a planarization process includes a chemical mechanical planarization (CMP) process which removes portions of the ILD layer 272 (and the CESL 270, if present) overlying the dummy gate structures 234 and planarizes a top surface of the device 200. In some embodiments, the CMP process also removes the hard mask 236 and exposes the dummy electrode layer 232 of the dummy gate structures 234.

Figure 17A:
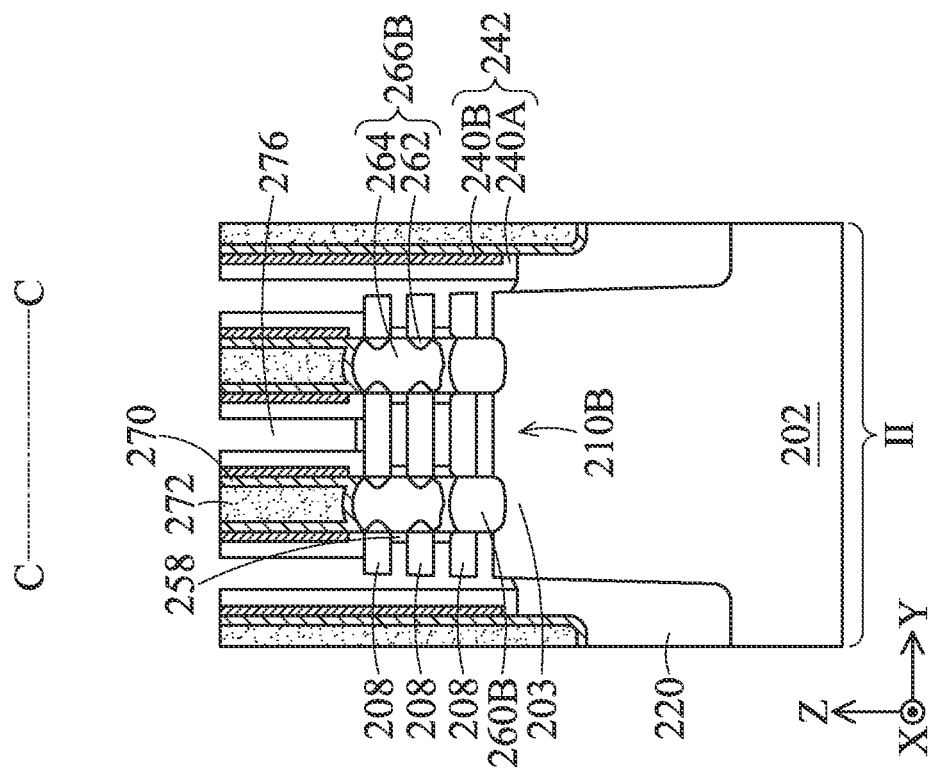
Figure 17B:
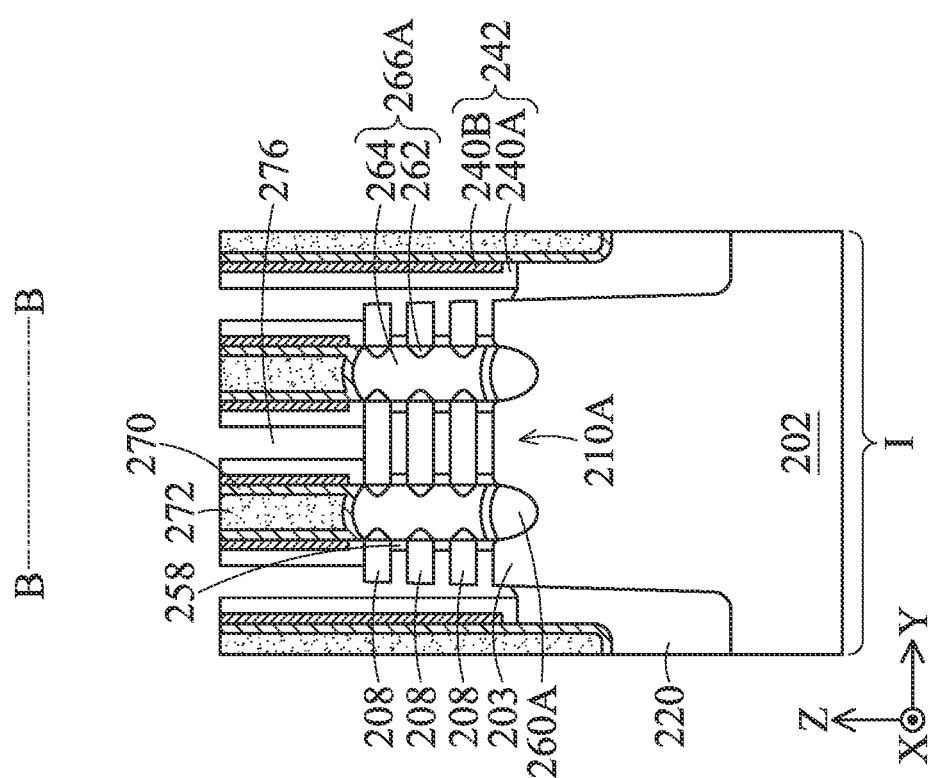
Figure 18A:
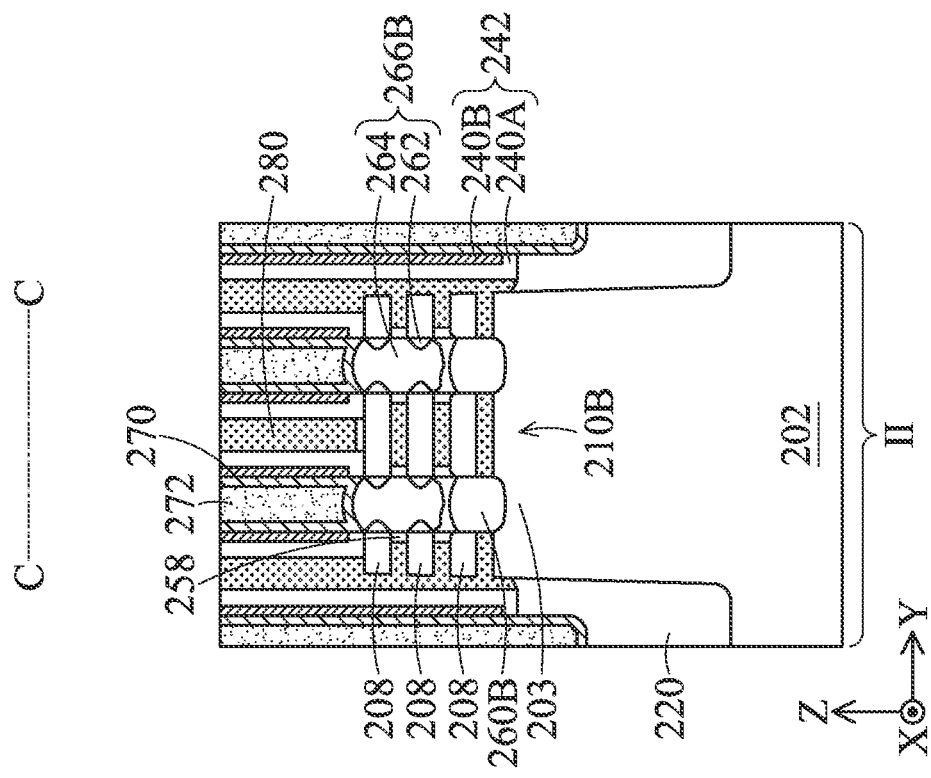
Figure 18B:
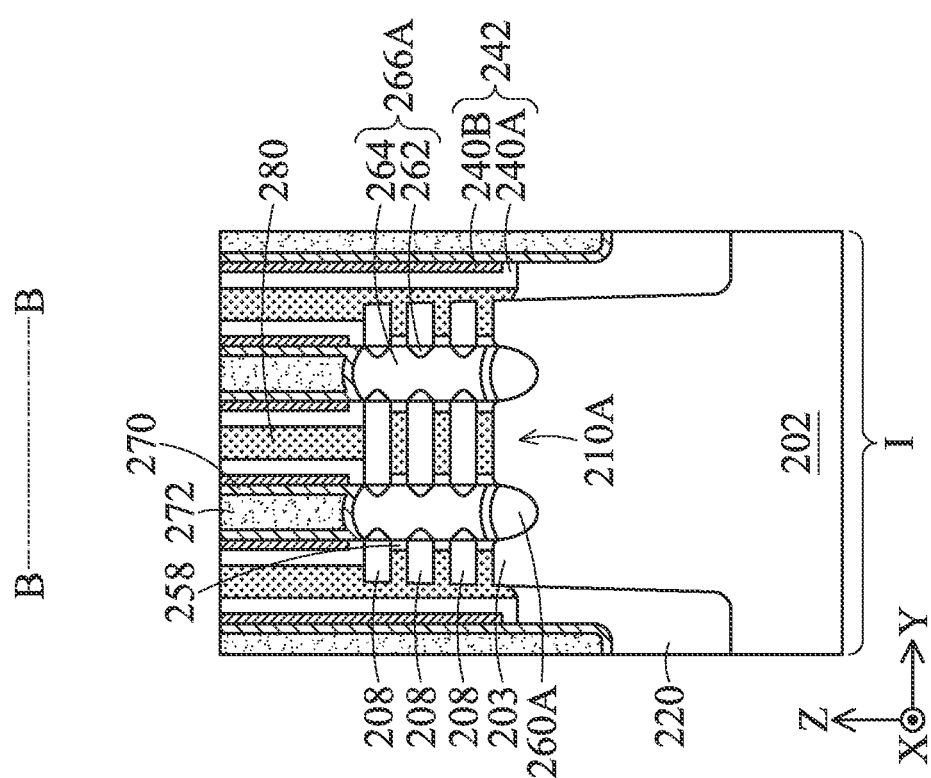

At operation 128, the method 100 (FIG. 1) removes the dummy gate structures 234 in forming gate trenches 276, such as shown in FIGS. 17A and 17B. In some embodiments, the removal of the dummy gate structure 234 may be performed using a selective etching process such as a selective wet etch, a selective dry etch, or a combination thereof. Operation 126 also removes the epitaxial layers 206 from the gate trenches 276. In an embodiment, the epitaxial layers 206 include SiGe and the epitaxial layers 208 are silicon, allowing for the selective removal of the epitaxial layers 206. In an embodiment, the epitaxial layers 206 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. In the region II, after the removal of the bottommost epitaxial layer 206, the buffer epitaxial layer 260B is exposed in the gate trenches 276.

At operation 130, the method 100 (FIG. 1) forms metal gate stacks (e.g., high-k metal gate (HK MG) stacks) 280 in the gate trenches 276. In some embodiments, each of the HK MG stacks 280 includes an interfacial layer, a high-K gate dielectric layer formed over the interfacial layer, and a gate electrode layer formed over the high-k gate dielectric layer. High-k gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the device 200.

In some embodiments, the interfacial layer of the HK MG stack 280 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k gate dielectric layer of the HK MG stack 280 may include a high-K dielectric such as hafnium oxide ($HfO_2$). Alternatively, the high-k gate dielectric layer of the HK MG stack 280 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k gate dielectric layer may be formed by ALD, physical vapor deposition (PVD), CVD, oxidation, and/or other suitable methods. The gate electrode layer of the HK MG stack 280 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of HK MG stack 280 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the HK MG stack 280 may be formed by ALD, PVD, CVD, e-beam evaporation, or other suitable process.

Further, the gate electrode layer 284 may be formed separately for NFET and PFET transistors which may use different metal layers (e.g., for providing an n-type or p-type work function).

The HK MG stack 280 includes portions that interpose and wrap around each of the epitaxial layers 208, which form channel layers of the multi-gate device 200. In the region I, each of the channel layers 208 is connected to the epitaxial layers 266A and conducts current flowing therebetween. Therefore, in the region I, each of the channel layers 208 is an active channel layer. As a comparison, in the region II, the bottommost channel layer 208 is connected to the buffer epitaxial layer 260B, which is an undoped region that isolates the bottommost channel layer 208 from conducting current. Therefore, in the region II, at least the bottommost channel layer 208 is an inactive channel layer. In some embodiments, depending on the depth of the S/D recesses 246B in the region II, two or more bottom channel layers 208 may be connected to the buffer epitaxial layer 260B and are inactive channel layers. In the region II, the buffer epitaxial layer 260B is also in physical contact and sandwiched laterally between two adjacent HK MG stacks 280.

Interposing the HK MG stack 280 and the epitaxial features 266 are the inner spacers 258, providing isolation. The structure of the HK MG stack 280, the epitaxial features 266, and the inner spacers 250 therebetween forms a parasitic capacitor. The smaller width and smaller volume of the epitaxial features 266B make the effective surface area of the parasitic capacitor in the region II less than in the region I, thus introducing less parasitic capacitance in the region II.

The device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide S/D epitaxial features of hybrid profiles and volumes in different regions, fitting high performance and low-parasitic capacitance/high-speed applications in the same IC chip. Furthermore, the hybrid S/D epitaxial feature formation process can be easily integrated into existing semiconductor fabrication processes.

In one exemplary aspect, the present disclosure is directed to a method. The method includes forming a stack of channel layers and sacrificial layers over a substrate, the channel layers and the sacrificial layers having different material compositions and being alternatingly disposed in a vertical direction, patterning the stack to form a fin-shape structure, recessing a portion of the fin-shape structure to form a recess, such that a top surface of the substrate under the recess is covered at least by a bottommost sacrificial layer of the stack, forming inner spacers on terminal ends of the sacrificial layers that are above the bottommost sacrificial layer, depositing an undoped layer in the recess, the undoped layer covering terminal ends of a bottommost channel layer of the stack, and forming a doped epitaxial feature over the undoped layer, the doped epitaxial feature covering terminal ends of the channel layers that are above the bottommost channel layer. In some embodiments, the method further includes etching the bottommost sacrificial layer to expose the substrate in the recess. The undoped layer also covers terminal ends of the bottommost sacrificial layer. In some embodiments, prior to the forming of the inner spacers, the top surface of the substrate under the recess is covered by the bottommost channel layer and the bottommost sacrificial layer. In some embodiments, the method further includes etching the bottommost channel layer and the bottommost sacrificial layer to expose the substrate in the recess. The undoped layer is in physical contact with the bottommost channel layer, the bottommost sacrificial layer, and the substrate. In some embodiments, the method further includes forming a sacrificial gate structure over the fin-shape structure, depositing gate sidewall spacers on sidewalls of the sacrificial gate structure, and removing the sacrificial gate structure to form a gate trench. The undoped layer is exposed in the gate trench. In some embodiments, the method further includes forming a metal gate structure in the gate trench. The undoped layer is in physical contact with the metal gate structure. In some embodiments, the fin-shape structure is a first fin-shape structure, the recess is a first recess, the undoped layer is a first undoped layer, and the patterning of the stack forms the first fin-shape structure and a second fin-shape structure, and the method further includes recessing a portion of the second fin-shape structure to form a second recess, and depositing a second undoped layer in the second recess, the second undoped layer being below and not in contact with a bottommost channel layer in the second fin-shape structure. In some embodiments, the method further includes forming an isolation feature over the substrate and surrounding the fin-shape structure. A top surface of the isolation feature intersects a sidewall of the fin-shape structure, and a bottom surface of the undoped layer is above the top surface of the isolation feature. In some embodiments, a bottommost inner spacer of the inner spacers is above a top surface of the bottommost sacrificial layer.

In another exemplary aspect, the present disclosure is directed to a method. The method includes forming an epitaxial stack of channel layers and sacrificial layers on a semiconductor substrate, the channel layers and the sacrificial layers having different material compositions and being alternatingly stacked in a vertical direction, patterning the epitaxial stack to form a first fin-shape structure protruding from a first region of the semiconductor substrate and a second fin-shape structure protruding from a second region of the semiconductor substrate, forming an isolation feature surrounding the first and second fin-shape structures, etching the first fin-shape structure to form a first recess in the first region, etching the second fin-shape structure to form a second recess in the second region, an aspect ratio of the first recess being larger than that of the second recess, depositing an undoped layer in the first and second recesses, and depositing a doped epitaxial layer over the undoped layer in the first and second recesses. In some embodiments, a bottom surface of the second recess is above that of the first recess. In some embodiments, a width of the first recess is larger than that of the second recess. In some embodiments, the undoped layer in the first recess is spaced from a bottommost channel layer of the first fin-shape structure, and the undoped layer in the second recess is in physical contact with a bottommost channel layer of the second fin-shape structure. In some embodiments, the undoped layer in the first recess is spaced from a bottommost sacrificial layer of the first fin-shape structure, and the undoped layer in the second recess is in physical contact with a bottommost sacrificial layer of the second fin-shape structure. In some embodiments, a bottom surface of the first recess is below a top surface of the isolation feature, and a bottom surface of the second recess is above the top surface of the isolation feature. In some embodiments, each of the channel layers in the first fin-shape structure is an active channel layer, and at least a bottommost channel layer in the second fin-shape structure is an inactive channel layer.

In yet another exemplary aspect, the present disclosure is directed to a semiconductor device. The semiconductor device includes a plurality of first channel layers vertically stacked above a substrate, a first metal gate structure wrapping each of the first channel layers, a first gate sidewall spacer disposed on sidewalls of the first metal gate structure, a plurality of second channel layers vertically stacked above the substrate, a second metal gate structure wrapping each of the second channel layers, a second gate sidewall spacer disposed on sidewalls of the second metal gate structure, a first undoped feature abutting a bottommost channel layer of the first channel layers, a first epitaxial feature abutting rest of the first channel layers other than the bottommost channel layer, a second undoped feature under a bottommost channel layer of the second channel layers, a second epitaxial feature abutting each of the second channel layers, a first inner spacer interposing the first epitaxial feature and the first metal gate structure, and a second inner spacer interposing the second epitaxial feature and the second metal gate structure. In some embodiments, the first undoped feature is in physical contact with the first metal gate structure. In some embodiments, a portion of the first metal gate structure is under the first inner spacer. In some embodiments, the semiconductor device further includes an isolation feature surrounding a portion of the substrate that is under the first channel layers. A bottom surface of the first undoped feature is above a top surface of the isolation feature that is under the first gate sidewall spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a stack of a plurality of channel layers and a plurality of sacrificial layers over a substrate, the plurality of channel layers and the plurality of sacrificial layers having different material compositions and being alternatingly disposed in a vertical direction;
    patterning the stack to form a fin-shape structure;
    recessing a portion of the fin-shape structure to form a recess, such that a top surface of the substrate directly under the recess is covered by a bottommost sacrificial layer of the plurality of sacrificial layers;

depositing an insulating layer in the recess to cover terminal ends of upper sacrificial layers of the plurality of the sacrificial layers while the bottommost sacrificial layer is present directly under the recess;

patterning the insulating layer to form inner spacers on the terminal ends of the upper sacrificial layers that are above the bottommost sacrificial layer;

extending the recess to expose terminal ends of the bottommost sacrificial layer and terminal ends of a bottommost channel layer of the plurality of channel layers;

depositing an undoped layer covering the terminal ends of the bottommost channel layer and directly contacts the exposed terminal ends of the bottommost sacrificial layer; and forming a doped epitaxial feature over the undoped layer, the doped epitaxial feature covering terminal ends of upper channel layers of the plurality of channel layers that are above the bottommost channel layer.

2. The method of claim 1, further comprising etching the bottommost sacrificial layer and the bottommost channel layer to expose the top surface of the substrate, wherein the undoped layer also covers the exposed top surface of the substrate.

3. The method of claim 1, wherein prior to the patterning the insulating layer, the top surface of the substrate directly under the recess is covered by the bottommost channel layer and the bottommost sacrificial layer.

4. The method of claim 3, further comprising:
etching the bottommost channel layer and the bottommost sacrificial layer to expose the top surface of the substrate, wherein the undoped layer is in physical contact with the bottommost channel layer, the bottommost sacrificial layer, and the substrate.

5. The method of claim 1, further comprising:
forming a sacrificial gate structure over the fin-shape structure;
depositing gate sidewall spacers on sidewalls of the sacrificial gate structure; and
removing the sacrificial gate structure to form a gate trench, wherein the undoped layer is exposed in the gate trench.

6. The method of claim 5, further comprising:
forming a metal gate structure in the gate trench, wherein the undoped layer is in physical contact with the metal gate structure.

7. The method of claim 1, wherein the fin-shape structure is a first fin-shape structure, the recess is a first recess, the undoped layer is a first undoped layer, and the patterning of the stack forms the first fin-shape structure and a second fin-shape structure, the method further includes:
recessing a portion of the second fin-shape structure to form a second recess; and
depositing a second undoped layer in the second recess, wherein the second undoped layer is below and not in contact with a bottommost channel layer of the plurality of channel layers in the second fin-shape structure.

8. The method of claim 1, further comprising:
forming an isolation feature over the substrate and surrounding the fin-shape structure, wherein a top surface of the isolation feature intersects a sidewall of the fin-shape structure, and wherein a bottom surface of the undoped layer is above the top surface of the isolation feature.

9. The method of claim 1, wherein a bottommost inner spacer of the inner spacers is above a top surface of the bottommost sacrificial layer.

10. A method, comprising:
forming an epitaxial stack of a plurality of channel layers and a plurality of sacrificial layers on a semiconductor substrate, the plurality of channel layers and the plurality of sacrificial layers having different material compositions and being alternatingly stacked in a vertical direction;
patterning the epitaxial stack to form a first fin-shape structure protruding from a first region of the semiconductor substrate and a second fin-shape structure protruding from a second region of the semiconductor substrate;
forming an isolation feature surrounding the first and second fin-shape structures;
etching the first fin-shape structure to form a first recess in the first region;
etching the second fin-shape structure to form a second recess in the second region, wherein an aspect ratio of the first recess is larger than that of the second recess;
depositing an insulating layer in the second recess to cover terminal ends of upper sacrificial layers of the plurality of sacrificial layers while a bottommost sacrificial layer of the plurality of sacrificial layers is present directly under the second recess in the second region;
patterning the insulating layer to form inner spacers on the terminal ends of the upper sacrificial layers that are above the bottommost sacrificial layer in the second region;
extending the second recess to expose terminal ends of the bottommost sacrificial layer and terminal ends of a bottommost channel layer of the plurality of channel layers in the second region;
depositing an undoped layer in the first recess and the extended second recess, the undoped layer in the extended second recess covers the terminal ends of the bottommost channel layer and directly contacts the exposed terminal ends of the bottommost sacrificial layer; and
depositing a doped epitaxial layer over the undoped layer in the first recess and the extended second recess.

11. The method of claim 10, wherein a bottom surface of the second recess is above that of the first recess.

12. The method of claim 10, wherein a width of the first recess is larger than that of the second recess.

13. The method of claim 10, wherein the undoped layer in the first recess is spaced from a bottommost channel layer of the first fin-shape structure, and wherein the undoped layer in the extended second recess is in physical contact with the bottommost channel layer of the second fin-shape structure.

14. The method of claim 10, wherein the undoped layer in the first recess is spaced from the bottommost sacrificial layer of the first fin-shape structure, and wherein the undoped layer in the extended second recess is in physical contact with the bottommost sacrificial layer of the second fin-shape structure.

15. The method of claim 10, wherein a bottom surface of the first recess is below a top surface of the isolation feature, and wherein a bottom surface of the extended second recess is above the top surface of the isolation feature.

16. The method of claim 10, wherein each of the plurality of channel layers in the first fin-shape structure is an active channel layer, and wherein at least the bottommost channel layer in the second fin-shape structure is an inactive channel layer.

17. A method, comprising:
- forming a stack of a plurality of channel layers and a plurality of sacrificial layers over a substrate, the plurality of channel layers and the plurality of sacrificial layers having different material compositions and being alternatingly disposed in a vertical direction;
- patterning the stack to form a fin-shape structure;
- forming a dummy gate structure over a channel region of the fin-shape structure;
- depositing a gate spacer along a sidewall of the dummy gate structure;
- recessing a source/drain region of the fin-shape structure to form a source/drain recess;
- depositing an insulating layer in the source/drain recess to cover terminal ends of upper sacrificial layers of the plurality of sacrificial layers while a bottommost sacrificial layer of the plurality of sacrificial layers is present directly under the source/drain recess;
- patterning the insulating layer to form inner spacers on the terminal ends of the upper sacrificial layers that are above the bottommost sacrificial layer;
- extending the source/drain recess to expose terminal ends of the bottommost sacrificial layer and terminal ends of a bottommost channel layer of the plurality of channel layers;
- forming a buffer layer in a bottom portion of the extended source/drain recess, wherein the buffer layer directly interfaces the terminal ends of the bottommost sacrificial layer and the terminal ends of the bottommost channel layer;
- forming an epitaxial feature over the buffer layer in the extended source/drain recess;
- removing the dummy gate structure to form a gate trench;
- removing the plurality of sacrificial layers from the gate trench; and
- forming a metal gate structure in the gate trench, wherein the metal gate structure directly interfaces the buffer layer.

18. The method of claim 17, wherein after the removing of the plurality of sacrificial layers, a sidewall of the buffer layer is exposed in the gate trench, and the metal gate structure interfaces the sidewall of the buffer layer.

19. The method of claim 17, wherein the epitaxial feature is spaced apart from the bottommost channel layer of the plurality of channel layers.

20. The method of claim 17, wherein, prior to the forming of the buffer layer, the source/drain recess is extended to expose a top surface of the bottommost sacrificial layer.

* * * * *